United States Patent
Fan et al.

(10) Patent No.: US 11,610,982 B2
(45) Date of Patent: Mar. 21, 2023

(54) VOID ELIMINATION FOR GAP-FILLING IN HIGH-ASPECT RATIO TRENCHES

(71) Applicant: Taiwan Semiconductor Manufacturing Co., Ltd., Hsinchu (TW)

(72) Inventors: Chih-Hsiang Fan, Hsinchu (TW); Tsung-Han Shen, Hsinchu (TW); Jia-Ming Lin, Tainan (TW); Wei-Chin Lee, Taipei (TW); Hsien-Ming Lee, Changhua (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 138 days.

(21) Appl. No.: 17/140,897

(22) Filed: Jan. 4, 2021

(65) Prior Publication Data

US 2022/0085187 A1    Mar. 17, 2022

Related U.S. Application Data

(60) Provisional application No. 63/078,443, filed on Sep. 15, 2020.

(51) Int. Cl.
*H01L 29/66* (2006.01)
*H01L 21/02* (2006.01)
(Continued)

(52) U.S. Cl.
CPC .... *H01L 29/6681* (2013.01); *H01L 21/02274* (2013.01); *H01L 21/823431* (2013.01);
(Continued)

(58) Field of Classification Search
CPC .......... H01L 29/6681; H01L 21/02274; H01L 21/823431; H01L 29/66545; H01L 29/6656; H01L 29/7851
See application file for complete search history.

(56) References Cited

U.S. PATENT DOCUMENTS

2006/0003523 A1* 1/2006 Haupt ............... H01L 21/02595
257/E21.396
2015/0061027 A1 3/2015 Hong et al.
(Continued)

FOREIGN PATENT DOCUMENTS

KR    20160001092 A    1/2016
KR    20170042558 A    4/2017
(Continued)

*Primary Examiner* — Monica D Harrison
*Assistant Examiner* — Andre C Stevenson
(74) *Attorney, Agent, or Firm* — Slater Matsil, LLP

(57) ABSTRACT

A method of forming a semiconductor device includes: forming a dummy gate over a fin, where the fin protrudes above a substrate; surrounding the dummy gate with a dielectric material; and replacing the dummy gate with a replacement gate structure, where replacing the dummy gate includes: forming a gate trench in the dielectric material, where forming the gate trench includes removing the dummy gate; forming a metal-gate stack in the gate trench, where forming the metal-gate stack includes forming a gate dielectric layer, a first work function layer, and a gap-filling material sequentially in the gate trench; and enlarging a volume of the gap-filling material in the gate trench.

20 Claims, 21 Drawing Sheets

(51) Int. Cl.
*H01L 29/78* (2006.01)
*H01L 21/8234* (2006.01)

(52) U.S. Cl.
CPC .... *H01L 29/6656* (2013.01); *H01L 29/66545* (2013.01); *H01L 29/7851* (2013.01)

(56) References Cited

U.S. PATENT DOCUMENTS

| | | |
|---|---|---|
| 2015/0380407 A1 | 12/2015 | Ji et al. |
| 2019/0035916 A1* | 1/2019 | Chiu ................. H01L 21/28088 |
| 2019/0096680 A1 | 3/2019 | Wei et al. |
| 2019/0103312 A1 | 4/2019 | Suen et al. |
| 2019/0165125 A1 | 5/2019 | Lai et al. |
| 2020/0075765 A1 | 3/2020 | Wang et al. |
| 2020/0279917 A1 | 9/2020 | Hsu et al. |
| 2020/0279929 A1 | 9/2020 | Lin et al. |
| 2021/0083113 A1 | 3/2021 | Wu et al. |

FOREIGN PATENT DOCUMENTS

| | | |
|---|---|---|
| KR | 20190038423 A | 4/2019 |
| KR | 20200078442 A | 7/2020 |
| TW | 202002292 A | 1/2020 |
| WO | 2016028267 A1 | 2/2016 |

* cited by examiner

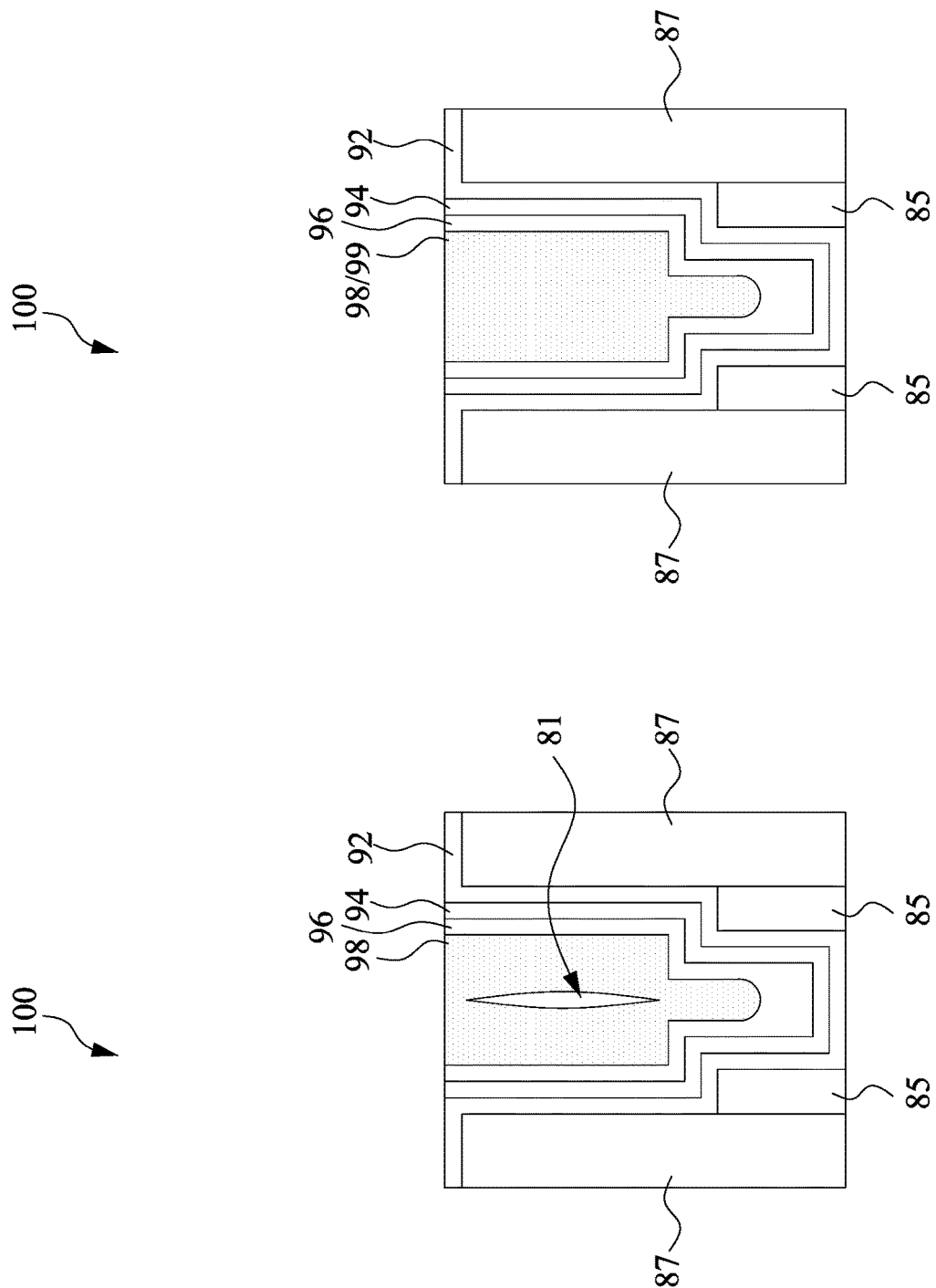

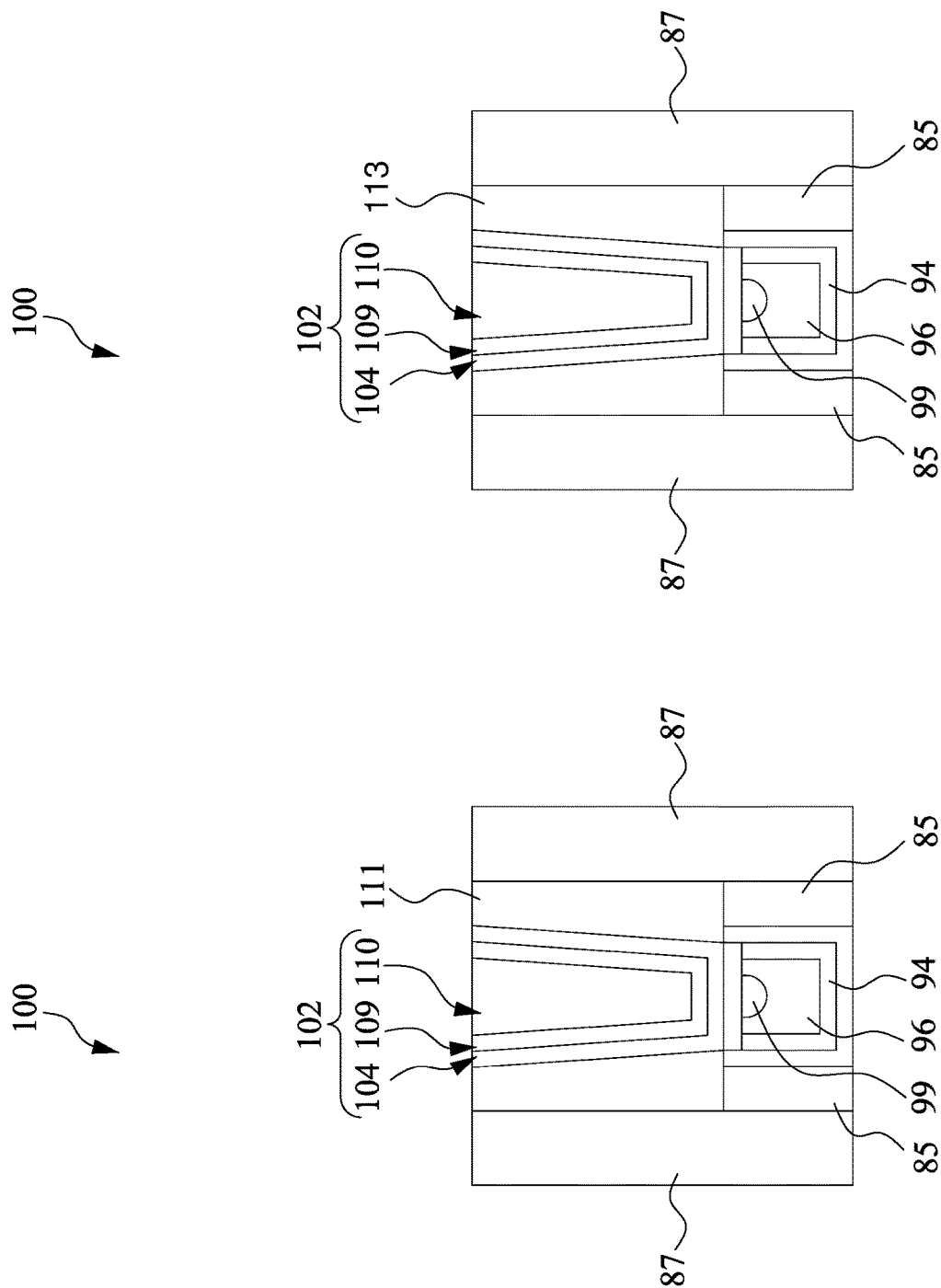

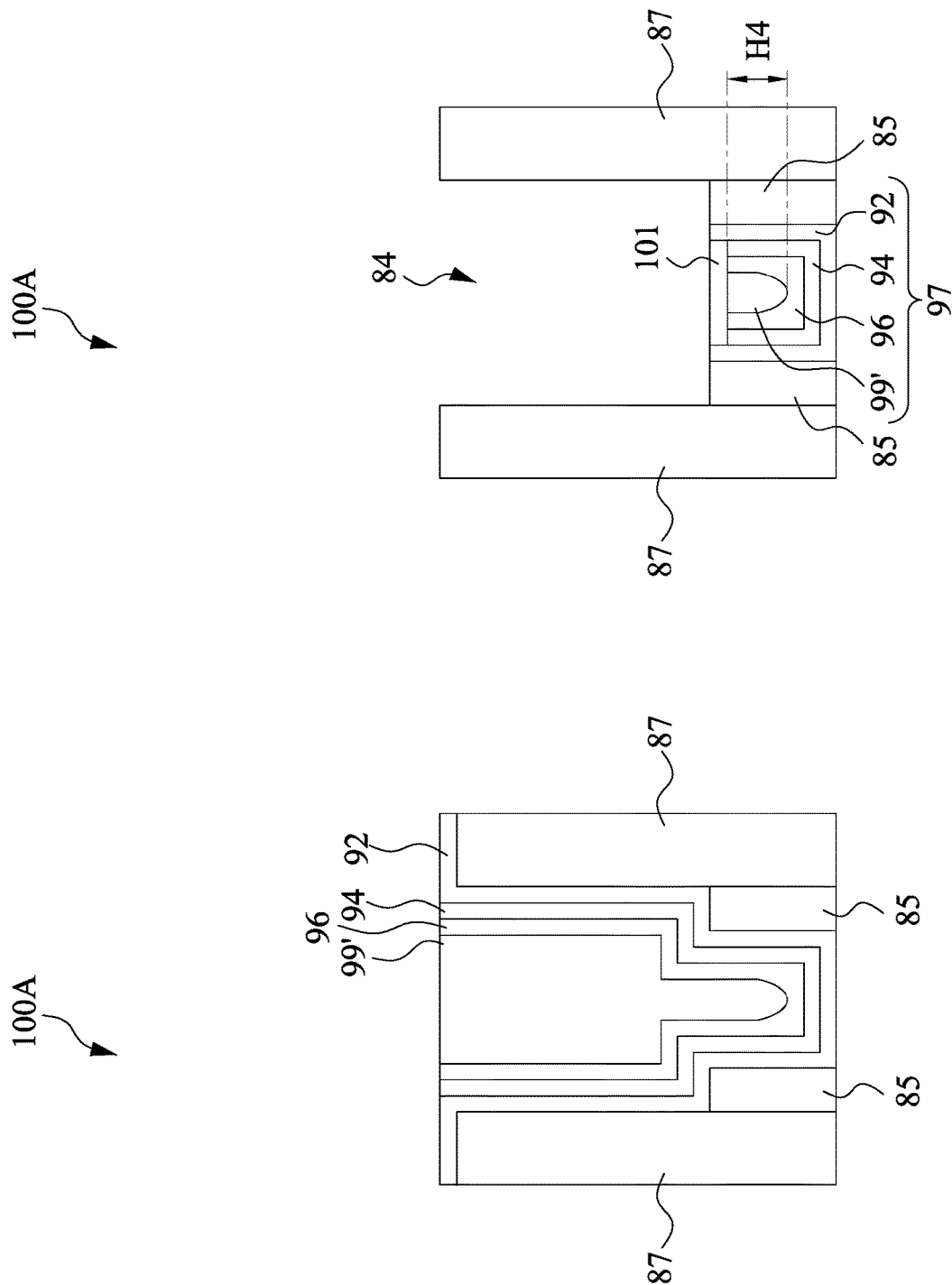

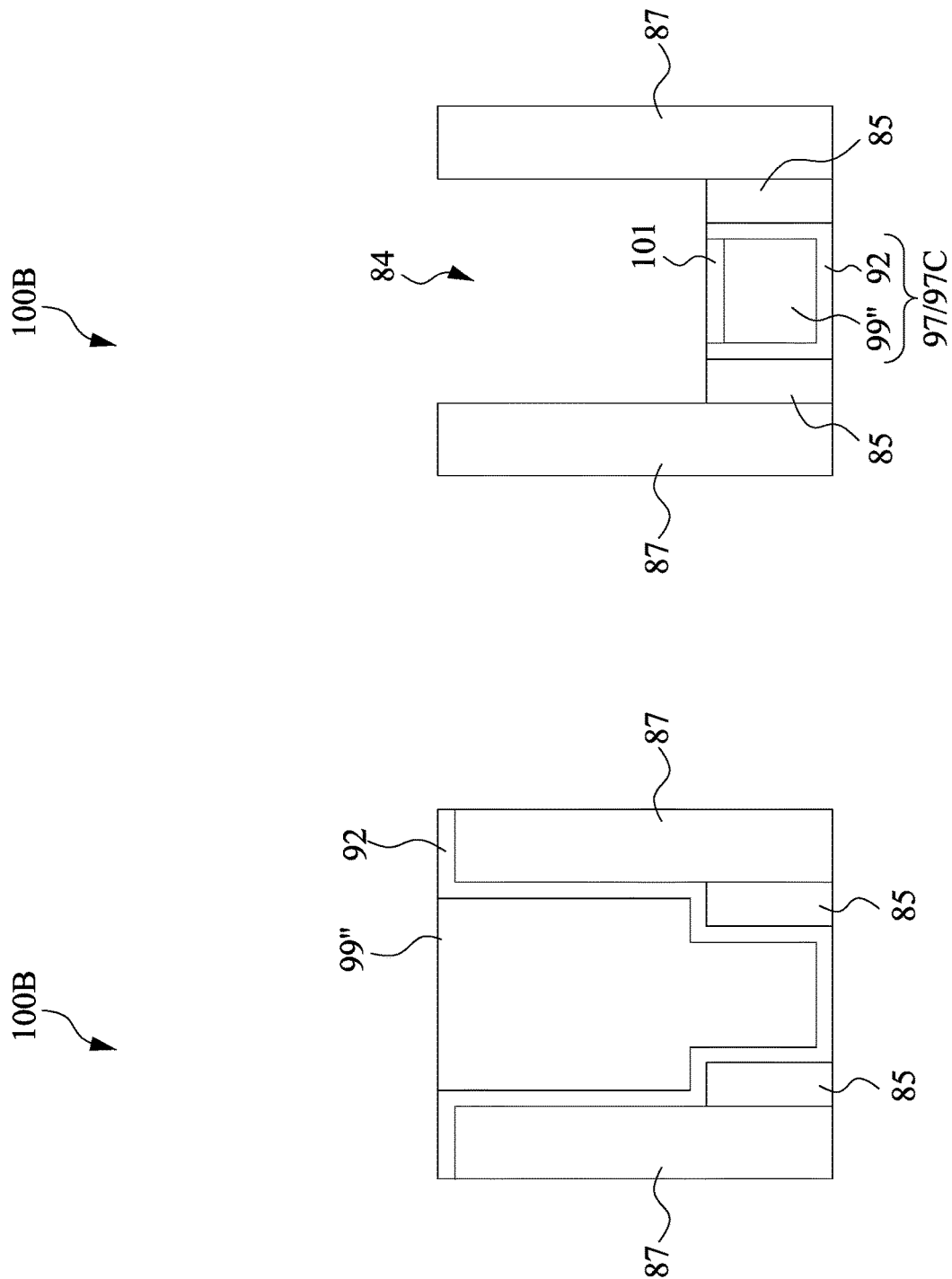

VOID ELIMINATION FOR GAP-FILLING IN HIGH-ASPECT RATIO TRENCHES

PRIORITY CLAIM AND CROSS-REFERENCE

This application claims priority to U.S. Provisional Patent Application No. 63/078,443, filed Sep. 15, 2020, entitled "Direct Void Elimination for Metal-Gate Gap-Filling in High-Aspect-Ratio Trenches in Advanced 3D Fin-FET Structures," which application is hereby incorporated by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-6, 7A-7C, and 8-17 illustrate cross-sectional views of a FinFET device at various stages of fabrication, in accordance with an embodiment.

FIGS. 18-20 illustrate cross-sectional views of a FinFET device at various stages of fabrication, in accordance with another embodiment.

FIGS. 21-23 illustrate cross-sectional views of a FinFET device at various stages of fabrication, in accordance with yet another embodiment.

DETAILED DESCRIPTION

Figure 1:
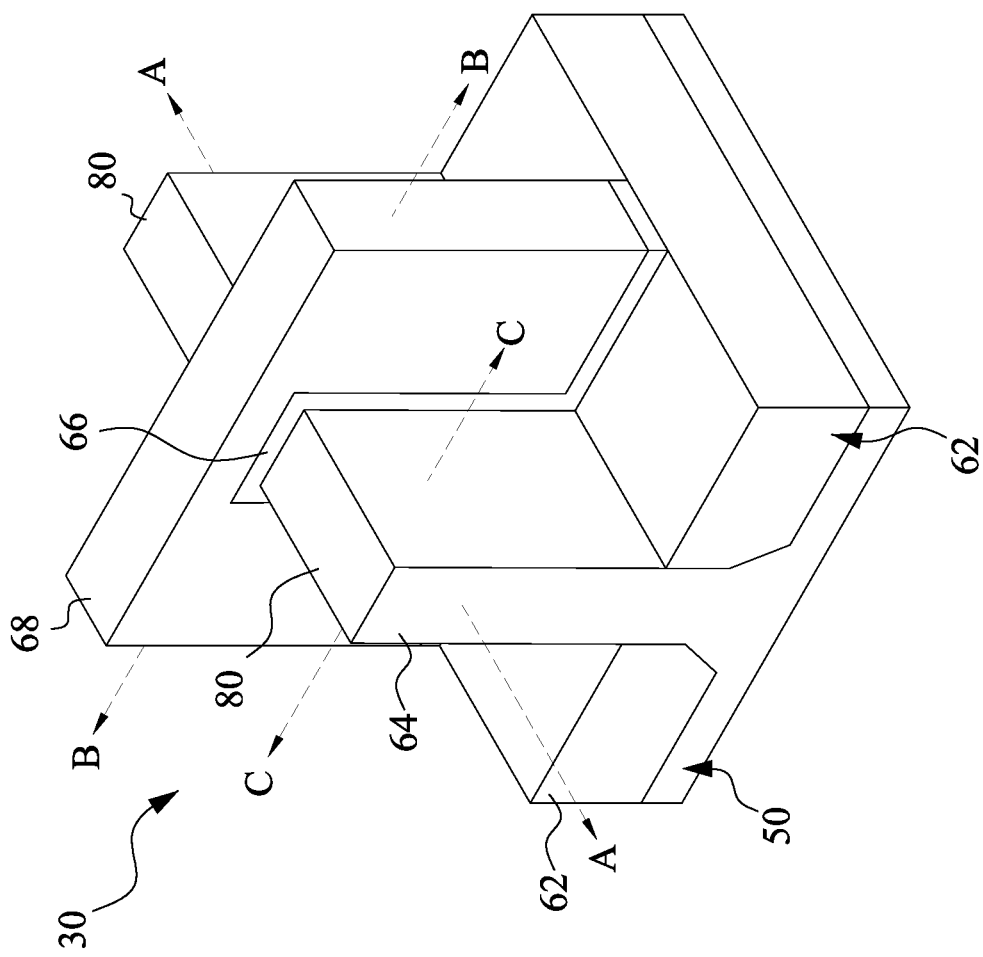
FIG. 1 illustrates a perspective view of a Fin Field-Effect Transistor (FinFET) device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference numeral in different figures refers to the same or similar element formed by a same or similar method using a same or similar material(s).

Embodiments of the present disclosure are discussed in the context of forming a FinFET device, and in particular, in the context of forming a replacement gate (e.g., a metal gate) of a FinFET device. The concept of the invention, however, is not limited to forming metal gates in FinFET devices, and is applicable to many other applications where trench filling with material(s) is performed. For example, the disclosed methods may be used for trenching filling in other types of devices, such as planar FET devices, nanosheet FET devices, or nanowire FET devices. Besides forming metal gates, the disclosed methods may also be used for forming other structures, such as vias. In addition, the disclosed methods may be used to fill trenches having shapes and/or dimensions different from those disclosed herein. These and other variations are fully intended to be included within the scope of the present disclosure.

In some embodiments, a replacement gate process includes forming a dummy gate over a fin, where the fin protrudes above a substrate; surrounding the dummy gate with a dielectric material; and replacing the dummy gate with a replacement gate structure, where replacing the dummy gate includes: forming a gate trench in the dielectric material by removing the dummy gate; forming a metal-gate stack in the gate trench, where forming the metal-gate stack includes forming a gate dielectric layer, a first work function layer, and a gap-filling material sequentially in the gate trench; and enlarging a volume of the gap-filling material in the gate trench by treating the gap-filling material with a fluorine treatment process. Due to the high aspect ratio of gate trench in advanced semiconductor processing nodes, seams (or gaps) may exist in the as-deposited gap-filling material, which seams may cause seam-induced punch-through effect in a subsequent metal gate etch-back process. By treating the gap-filling material with the fluorine treatment process, the seams are removed, thereby preventing or reducing the seam-induced punch-through effect.

FIG. 1 illustrates an example of a FinFET 30 in a perspective view. The FinFET 30 includes a substrate 50 and a fin 64 protruding above the substrate 50. Isolation regions 62 are formed on opposing sides of the fin 64, with the fin 64 protruding above the isolation regions 62. A gate dielectric 66 is along sidewalls and over a top surface of the fin 64, and a gate 68 is over the gate dielectric 66. Source/drain regions 80 are in the fin 64 and on opposing sides of the gate dielectric 66 and the gate 68. FIG. 1 further illustrates reference cross-sections that are used in subsequent figures. Cross-section B-B extends along a longitudinal axis of the gate 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across the source/drain region 80. Subsequent figures refer to these reference cross-sections for clarity.

FIGS. 2-6, 7A-7C, and 8-17 illustrate cross-sectional views of a FinFET device 100 at various stages of fabrication, in accordance with an embodiment. The FinFET device 100 is similar to the FinFET 30 in FIG. 1, but with multiple fins and multiple gate structures. FIGS. 2-5 illustrate cross-sectional views of the FinFET device 100 along cross-section B-B. FIGS. 6, 7A, and 8-17 illustrate cross-sectional views of the FinFET device 100 along cross-section A-A, and FIGS. 7B and 7C illustrate cross-sectional views of the FinFET device 100 along cross-section C-C.

Figure 2:
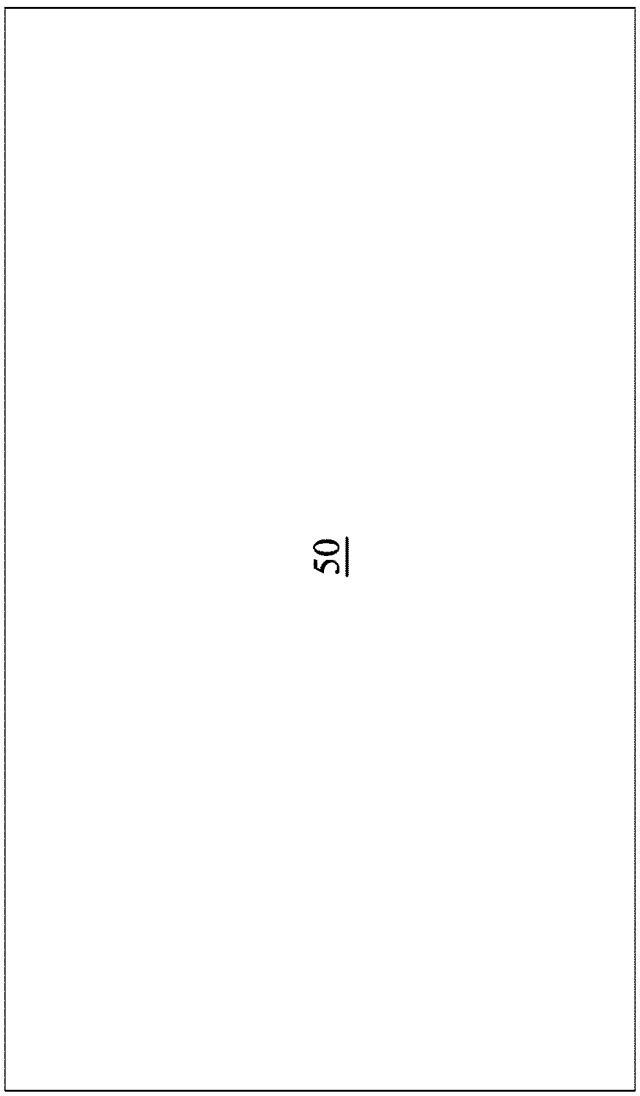

FIG. 2 illustrates a cross-sectional view of the substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
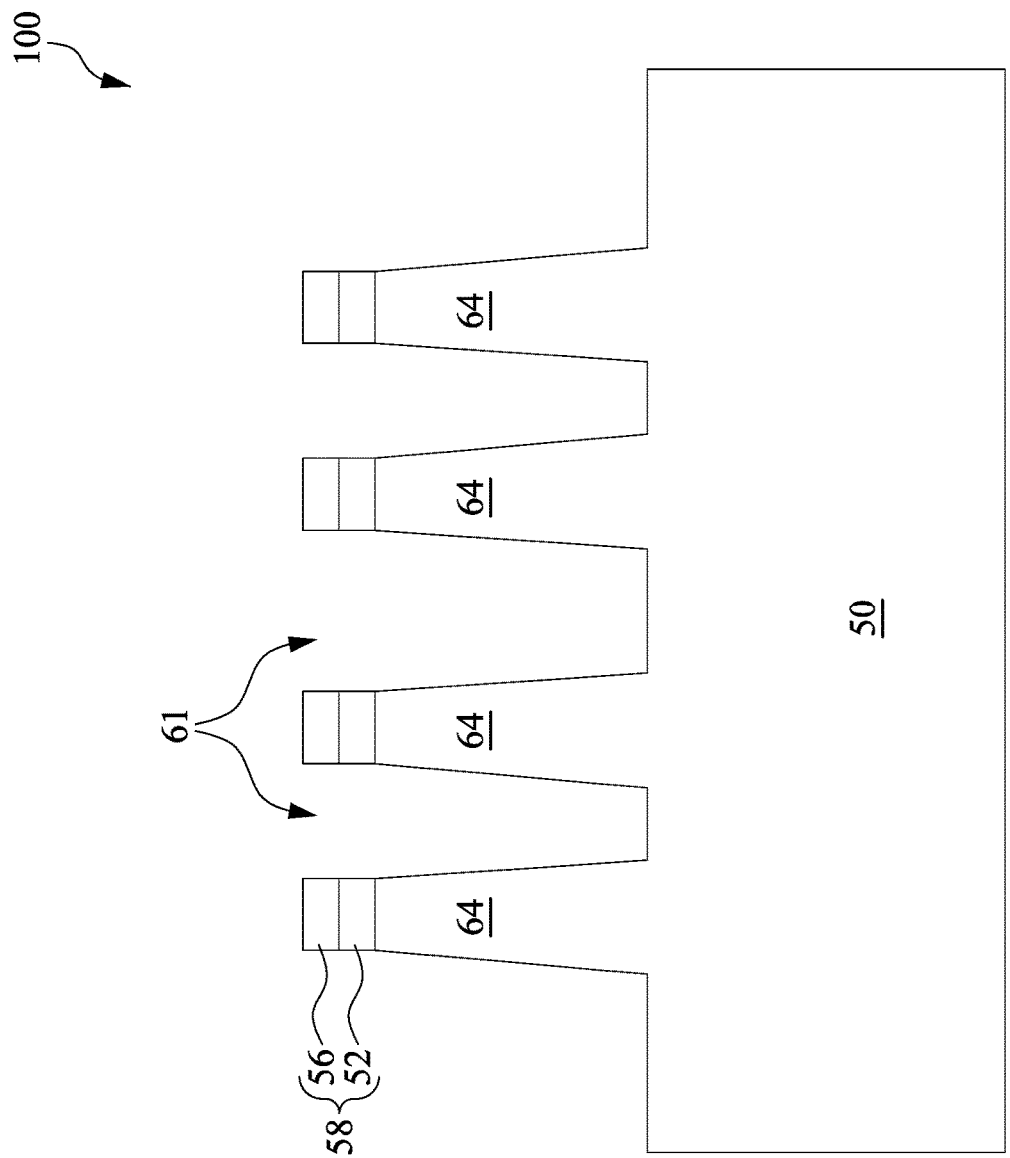

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56. In some embodiments, the pad nitride layer 56 is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor fins 64 between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etch may be anisotropic. In some embodiments, the trenches 61 may be strips (viewed from in the top) parallel to each other, and closely spaced with respect to each other. In some embodiments, the trenches 61 may be continuous and surround the semiconductor fins 64. The semiconductor fins 64 may also be referred to as fins 64 hereinafter.

The fins 64 may be patterned by any suitable method. For example, the fins 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
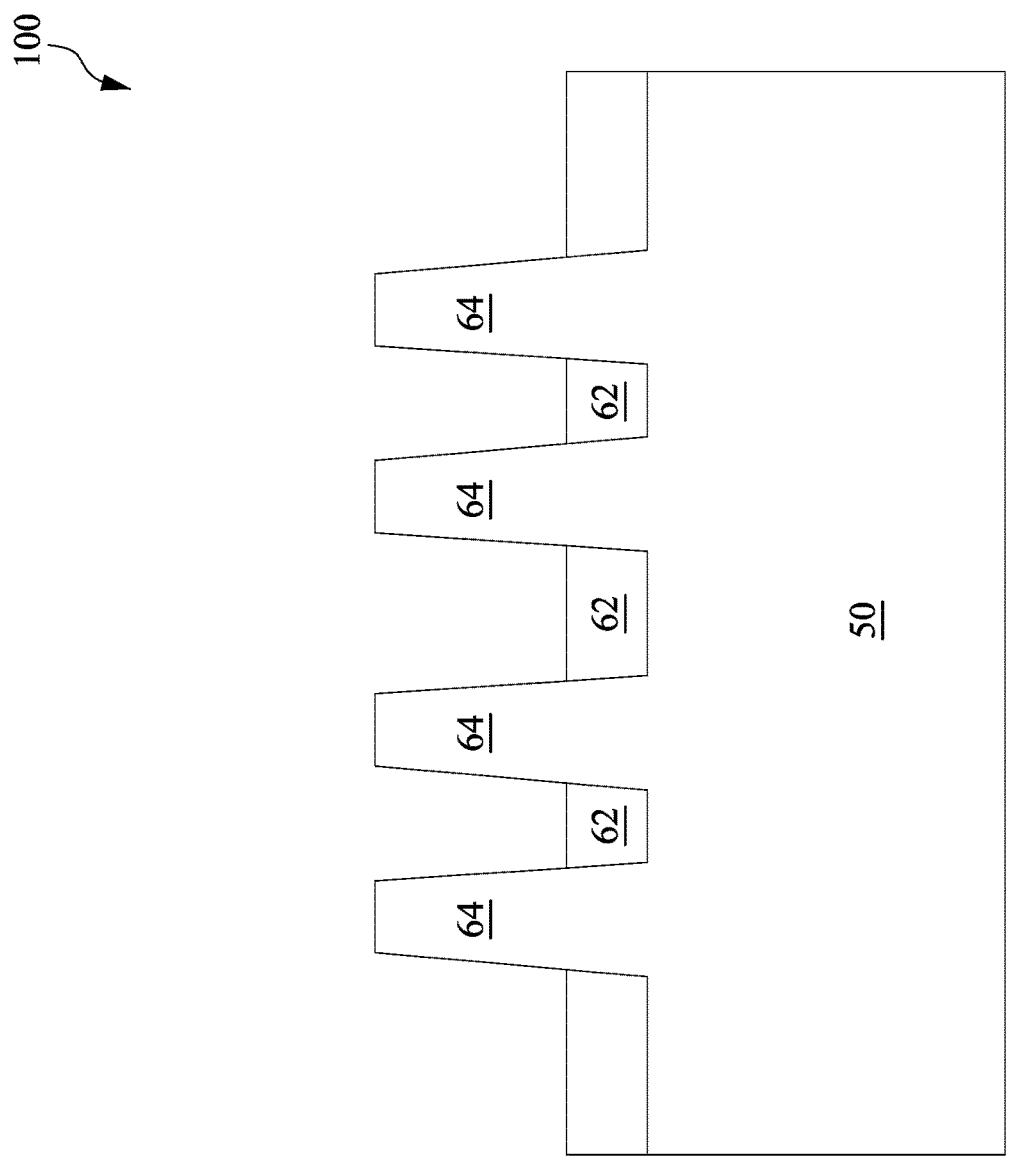

FIG. 4 illustrates the formation of an insulation material between neighboring semiconductor fins 64 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 62 and top surfaces of the semiconductor fins 64 that are coplanar (not shown). The patterned mask 58 (see FIG. 3) may also be removed by the planarization process.

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions 62. The isolation regions 62 are recessed such that the upper portions of the semiconductor fins 64 protrude from between neighboring STI regions 62. The top surfaces of the STI regions 62 may have a flat surface (as illustrated), a convex surface, a concave surface (such as dishing), or a combination thereof. The top surfaces of the STI regions 62 may be formed flat, convex, and/or concave by an appropriate etch. The isolation regions 62 may be recessed using an acceptable etching process, such as one that is selective to the material of the isolation regions 62. For example, a dry etch or a wet etch using dilute hydrofluoric (dHF) acid may be performed to recess the isolation regions 62.

FIGS. 2 through 4 illustrate an embodiment of forming fins 64, but fins may be formed in various different processes. For example, a top portion of the substrate 50 may be replaced by a suitable material, such as an epitaxial material suitable for an intended type (e.g., N-type or P-type) of semiconductor devices to be formed. Thereafter, the substrate 50, with epitaxial material on top, is patterned to form semiconductor fins 64 that comprise the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 64 may comprise silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
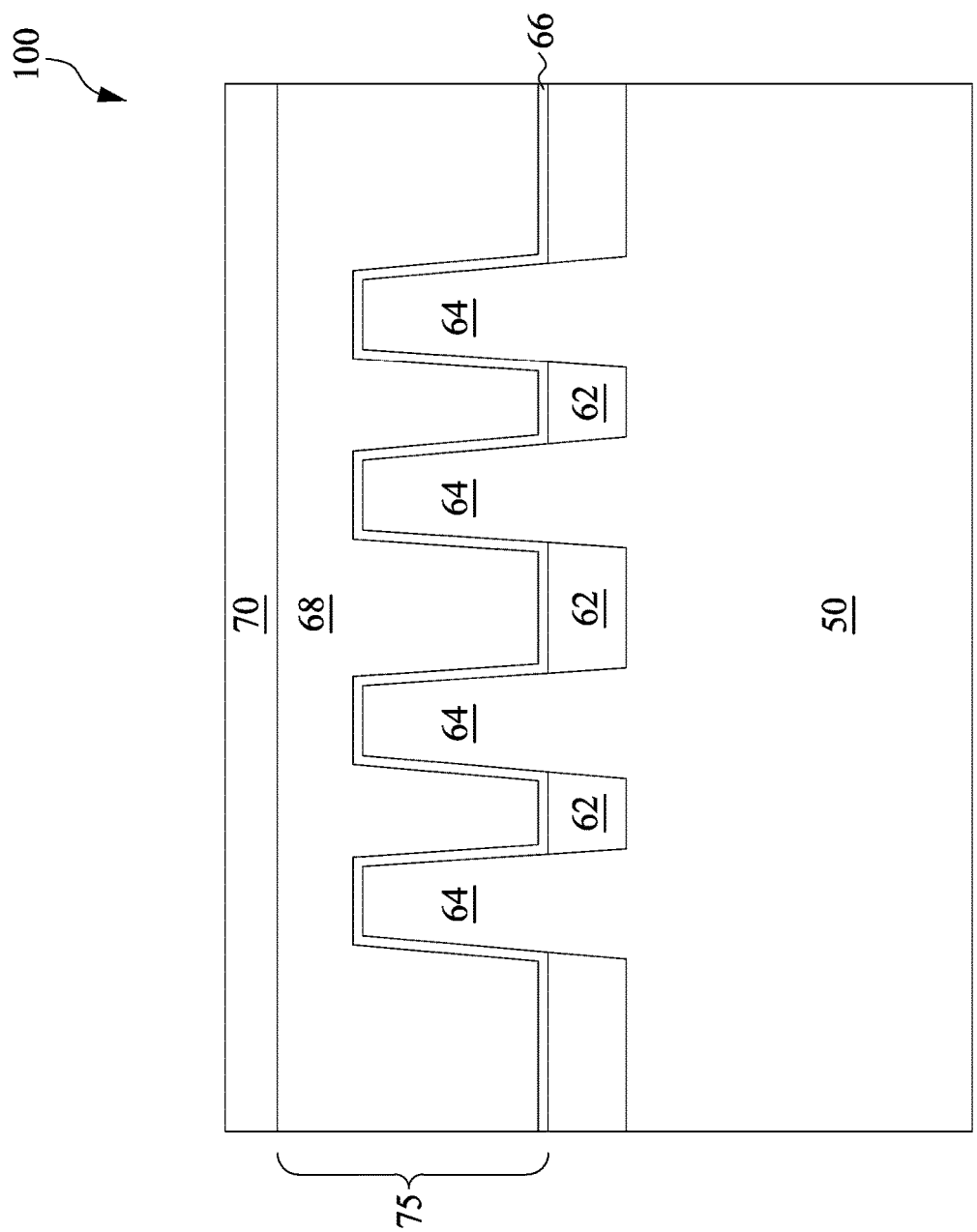

FIG. 5 illustrates the formation of dummy gate structures 75. The dummy gate structure 75 includes gate dielectric 66 and gate 68, in some embodiments. A mask 70 may be formed over the dummy gate structure 75. To form the dummy gate structure 75, a dielectric layer is formed on the semiconductor fins 64. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 then may be transferred to the gate layer and the dielectric layer by an acceptable etching technique to form gate 68 and gate dielectric 66, respectively. The gate 68 and the gate dielectric 66 cover respective channel regions of the semiconductor fins 64. The gate 68 may also have a lengthwise direction substantially perpendicular to the lengthwise direction of respective semiconductor fins 64.

The gate dielectric 66 is shown to be formed over the fins 64 (e.g., over top surfaces and sidewalls of the fins 64) and over the STI regions 62 in the example of FIG. 5. In other embodiments, the gate dielectric 66 may be formed by, e.g., thermal oxidization of a material of the fins 64, and therefore, may be formed over the fins 64 but not over the STI regions 62. These and other variations are fully intended to be included within the scope of the present disclosure.

Figure 6:
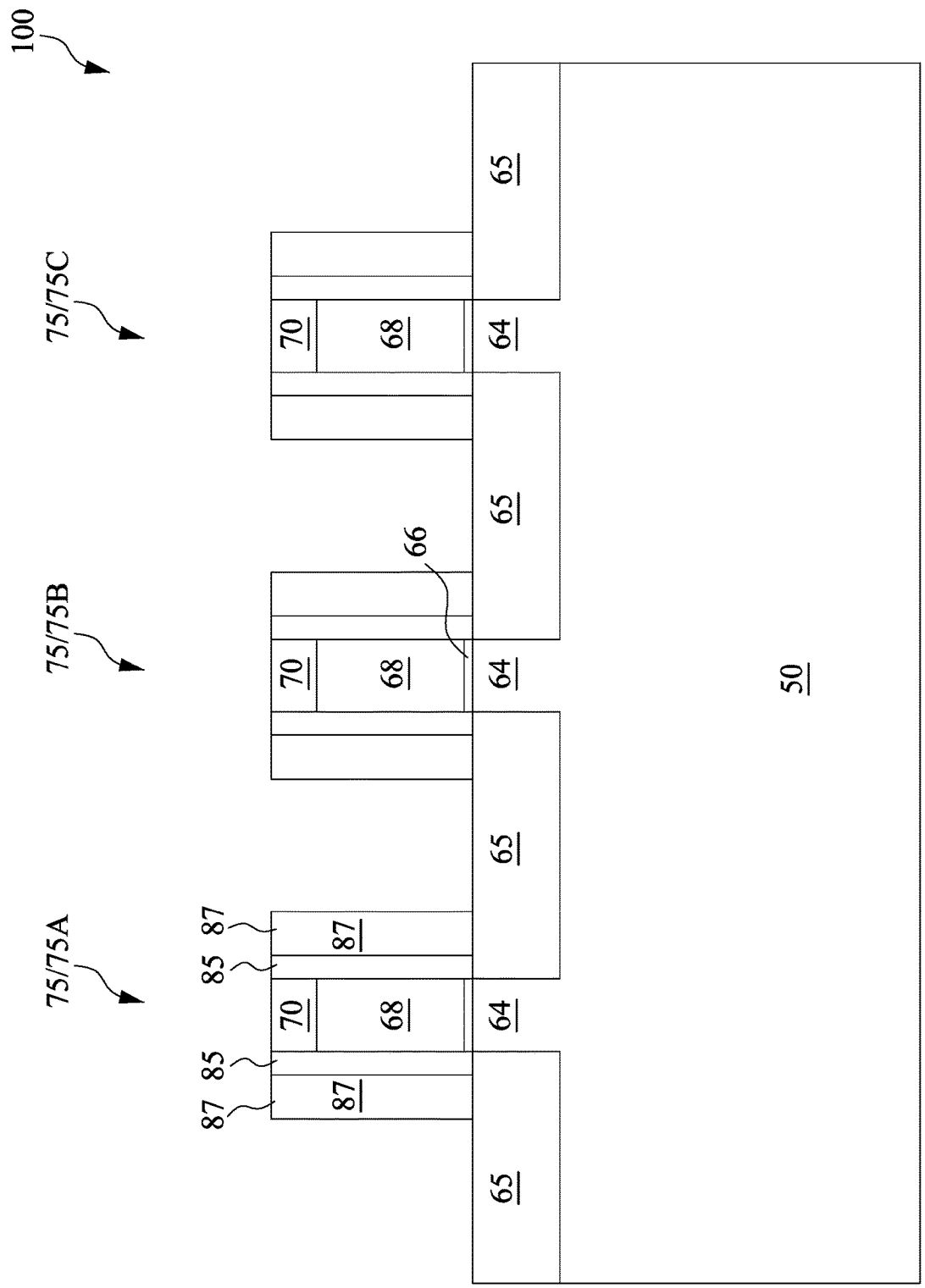
Figure 7A:
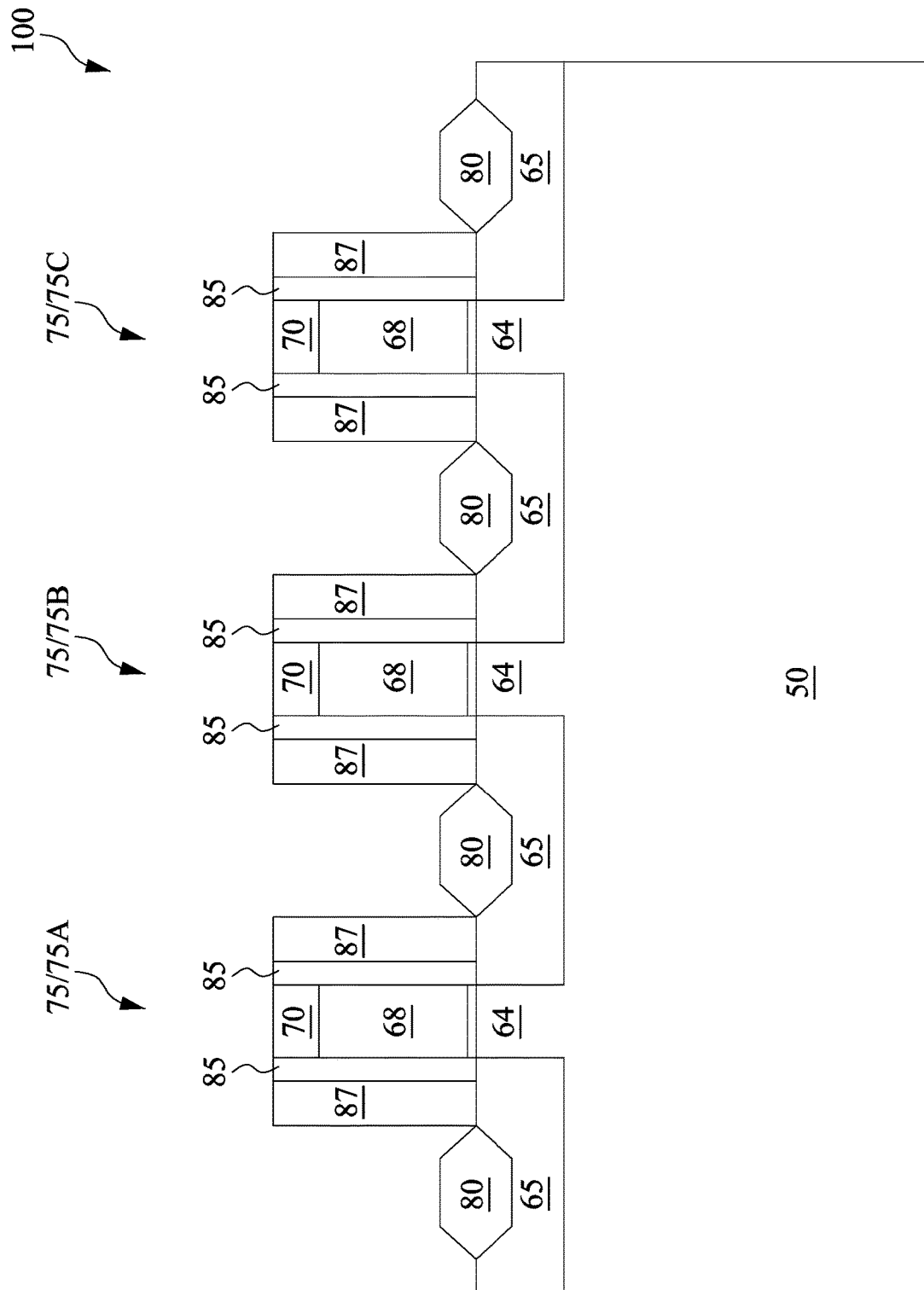
Figure 7B:
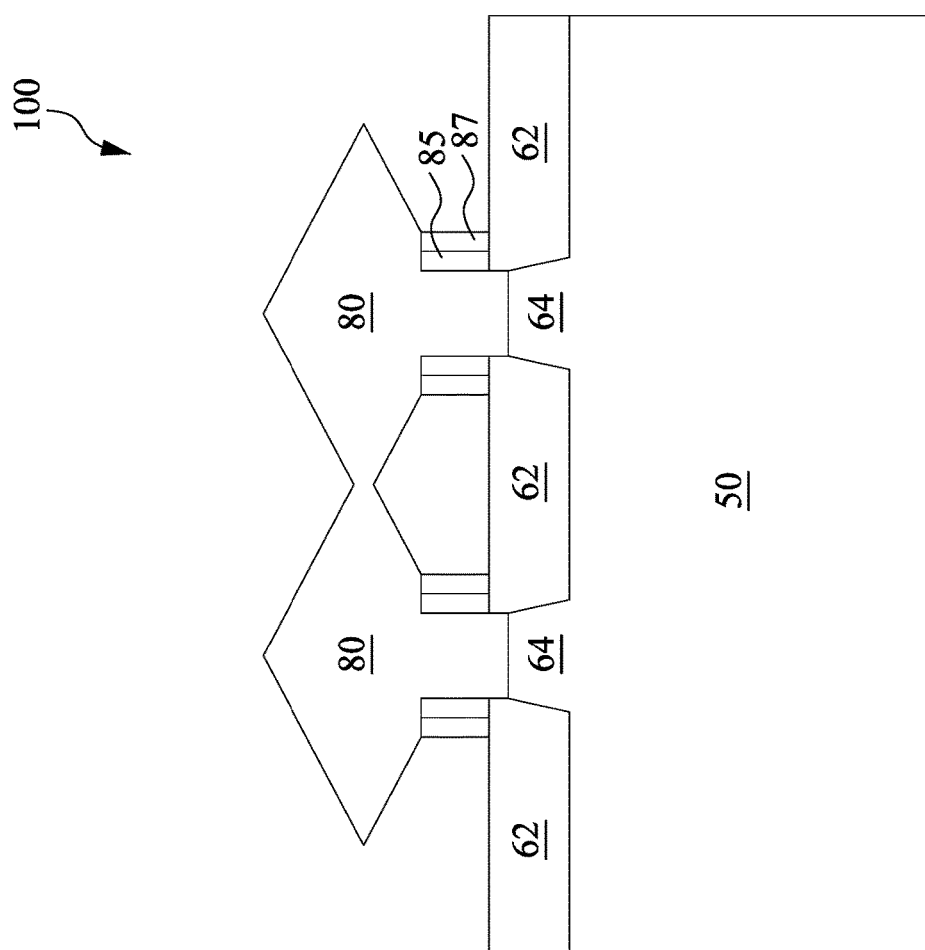
Figure 7C:
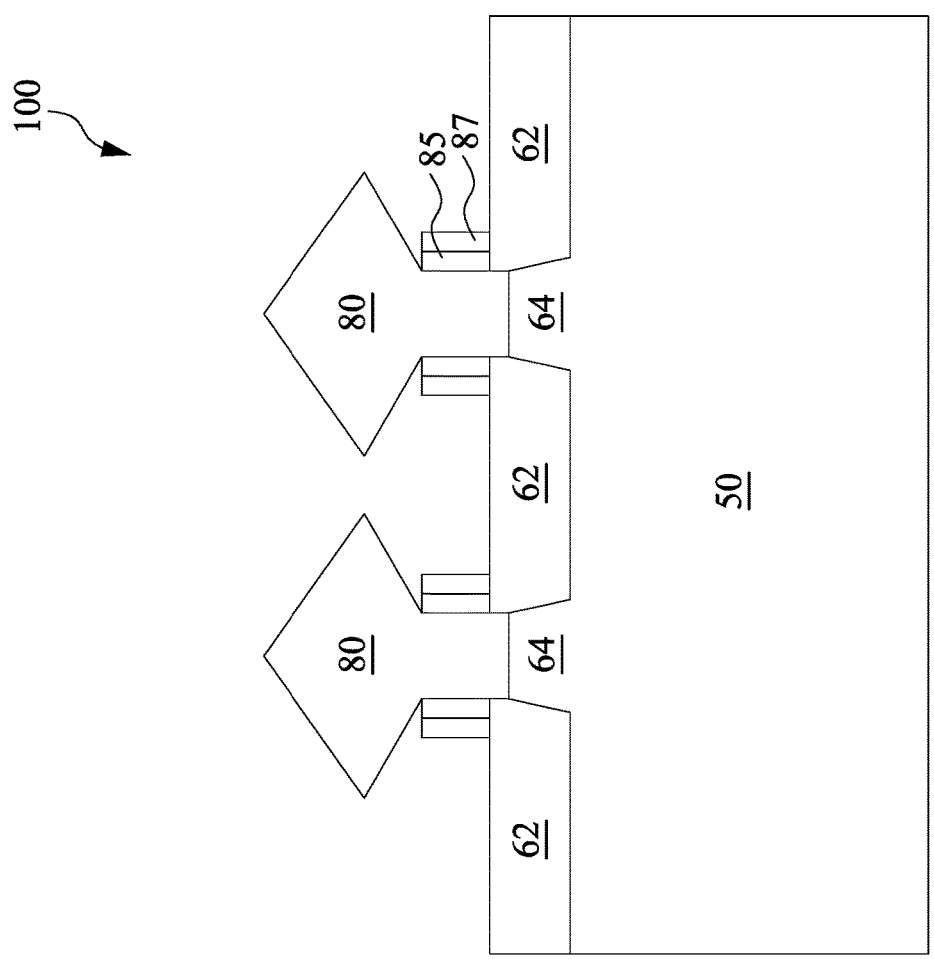
Figure 8:
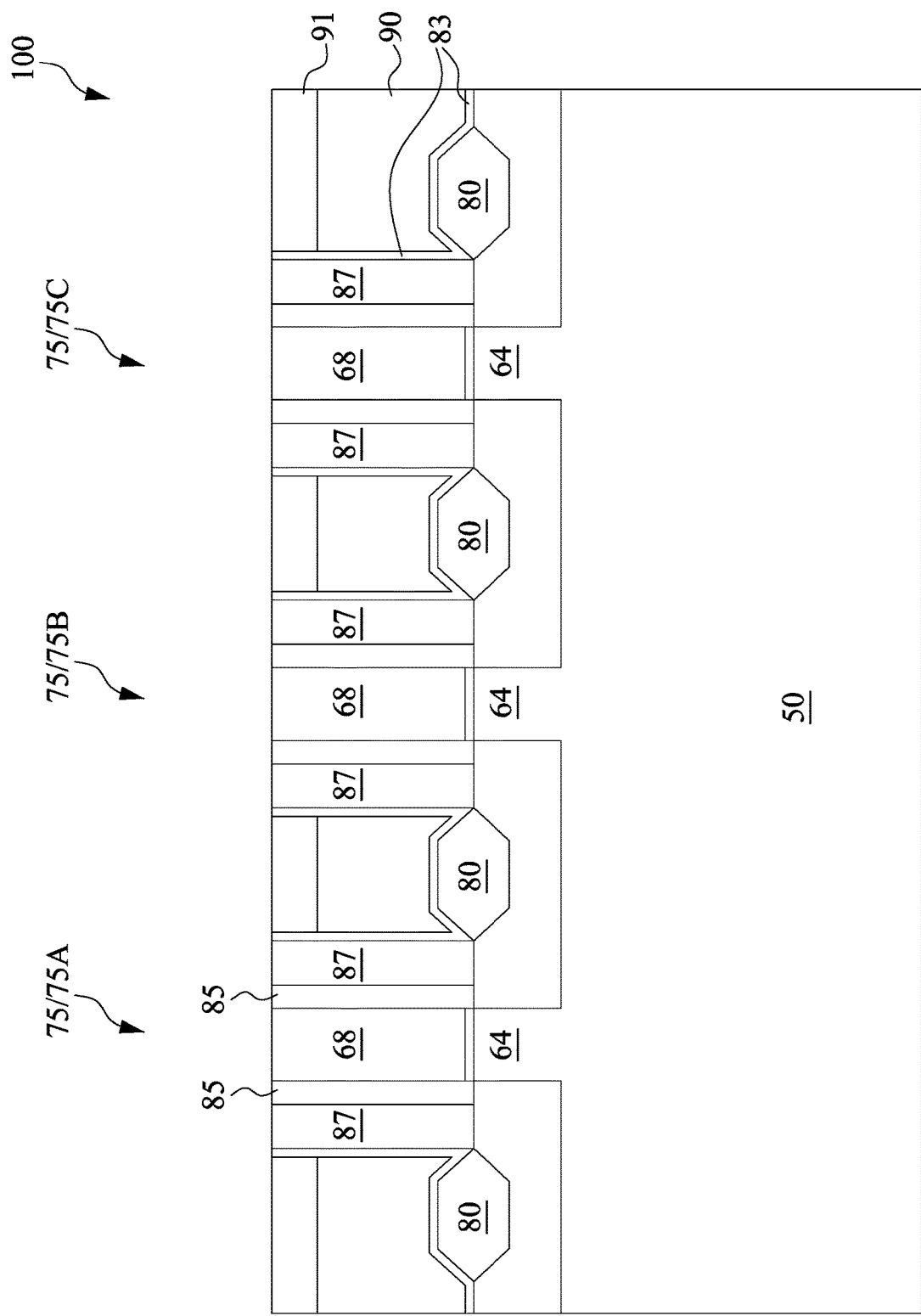

FIGS. 6, 7A, and 8-17 illustrate the cross-sectional views of further processing of the FinFET device 100 along cross-section A-A (along a longitudinal axis of the fin 64). FIGS. 7B and 7C illustrate two embodiment cross-sectional views of the FinFET device 100 at the processing step of FIG. 7A, but along cross-section C-C. In FIGS. 6-8, three dummy gate structures 75A, 75B, and 75C are illustrated over the fin 64. For simplicity, the dummy gate structures 75A, 75B, and 75C may be collectively referred to as dummy gate structures 75. One skilled in the art will appreciate that more or less than three gate structures may be formed over the fin 64, these and other variations are fully intended to be included within the scope of the present disclosure.

As illustrated in FIG. 6, lightly doped drain (LDD) regions 65 are formed in the fins 64. The LDD regions 65 may be formed by a plasma doping process. The plasma doping process may include forming and patterning masks such as a photoresist to cover the regions of the FinFET that are to be protected from the plasma doping process. The plasma doping process may implant N-type or P-type impurities in the fins 64 to form the LDD regions 65. For example, P-type impurities, such as boron, may be implanted in the fin 64 to form the LDD regions 65 for a P-type device. As another example, N-type impurities, such as phosphorus, may be implanted in the fin 64 to form the LDD regions 65 for an N-type device. In some embodiments, the LDD regions 65 abut the channel region of the FinFET device 100. Portions of the LDD regions 65 may extend under gate 68 and into the channel region of the FinFET device 100. FIG. 6 illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 87/85 are formed. In some embodiments, the LDD regions 65 are omitted.

Still referring to FIG. 6, after the LDD regions 65 are formed, first gate spacers 85 are formed around (e.g., along and contacting the sidewalls of) the dummy gate structures 75, and second gate spacers 87 are formed around (e.g., along and contacting the sidewalls of) the first gate spacers 85. For example, the first gate spacer 85 may be formed on opposing sidewalls of the dummy gate structure 75. The second gate spacer 87 is formed on the first gate spacer 85. The first gate spacer 85 may be a low-k spacer and may be formed of a suitable dielectric material, such as silicon oxide, silicon oxycarbonitride, or the like. The second gate spacer 87 may be formed of a nitride, such as silicon nitride, silicon oxynitride, silicon carbonitride, the like, or a combination thereof. Any suitable deposition method, such as thermal oxidation, chemical vapor deposition (CVD), or the like, may be used to form the first gate spacer 85 and the second gate spacer 87. In the illustrated embodiment, the first gate spacer 85 and the second gate spacer 87 are formed of different materials to provide etching selectivity in subsequent processing. The first gate spacer 85 and the second gate spacer 87 may be collectively referred to as gate spacers 85/87.

The shapes and formation methods of the gate spacers (e.g., 85 and 87) as illustrated in FIG. 6 are merely non-limiting examples, and other shapes and formation methods are possible. These and other variations are fully intended to be included within the scope of the present disclosure.

Next, in FIG. 7A, recesses are formed in the fins 64 adjacent to the dummy gate structures 75, e.g., between adjacent dummy gate structures 75 and/or next to a dummy gate structure 75, and source/drain regions 80 are formed in the recesses. The recesses are formed by, e.g., an anisotropic etching process using the dummy gate structures 75 as an etching mask, in some embodiments, although any other suitable etching process may also be used.

The source/drain regions 80 are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 7A, the epitaxial source/drain regions 80 may have surfaces raised from respective surfaces of the fins 64 (e.g. raised above the non-recessed portions of the fins 64) and may have facets. The source/drain regions 80 of the adjacent fins 64 may merge to form a continuous epitaxial source/drain region 80 (see FIG. 7B). In some embodiments, the source/drain regions 80 for adjacent fins 64 do not merge together and remain separate source/drain regions 80 (see FIG. 7C). In some embodiments, the resulting FinFET is an n-type FinFET, and source/drain regions 80 comprise silicon carbide (SiC), silicon phosphorous (SiP), phosphorous-doped silicon carbon (SiCP), or the like. In some embodiments, the resulting FinFET is a p-type FinFET, and source/drain regions 80 comprise SiGe, and a p-type impurity such as boron or indium.

The epitaxial source/drain regions 80 may be implanted with dopants to form source/drain regions 80 followed by an anneal process. The implanting process may include forming and patterning masks such as a photoresist to cover the regions of the FinFET that are to be protected from the implanting process. The source/drain regions 80 may have an impurity (e.g., dopant) concentration in a range from about 1E19 $cm^{-3}$ to about 1E21 $cm^{-3}$. P-type impurities, such as boron or indium, may be implanted in the source/drain region 80 of a P-type transistor. N-type impurities, such as phosphorous or arsenide, may be implanted in the source/drain regions 80 of an N-type transistor. In some embodiments, the epitaxial source/drain regions may be in situ doped during growth.

Next, as illustrated in FIG. 8, a contact etch stop layer (CESL) 83 is formed over the structure illustrated in FIG. 7A. The CESL 83 functions as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, an interlayer dielectric (ILD) 90 is formed over the CESL 83 and over the dummy gate structures 75 (e.g., 75A, 75B, and 75C). In some embodiments, the ILD 90 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 90 is formed, a dielectric layer 91 is formed over the ILD 90. The dielectric layer 91 functions as a protection layer to prevent or reduces the loss of the ILD 90 in subsequent etching processes. The dielectric layer 91 may be formed of a suitable material, such as silicon nitride, silicon carbonitride, or the like, using a suitable method such as CVD, PECVD, or FCVD. After the dielectric layer 91 is formed, a planarization process, such as a CMP process, may be performed to achieve a level upper surface for the dielectric layer 91. The CMP may also remove the mask 70 and portions of the CESL 83 disposed over the gate 68. After the planarization process, the upper surface of the dielectric layer 91 is level with the upper surface of the gate 68, in some embodiments.

An embodiment gate-last process (sometimes referred to as replacement gate process) is performed subsequently to replace the gate 68 and the gate dielectric 66 of the dummy gate structure 75 with an active gate (may also be referred to as a replacement gate or a metal gate).

Figure 9:
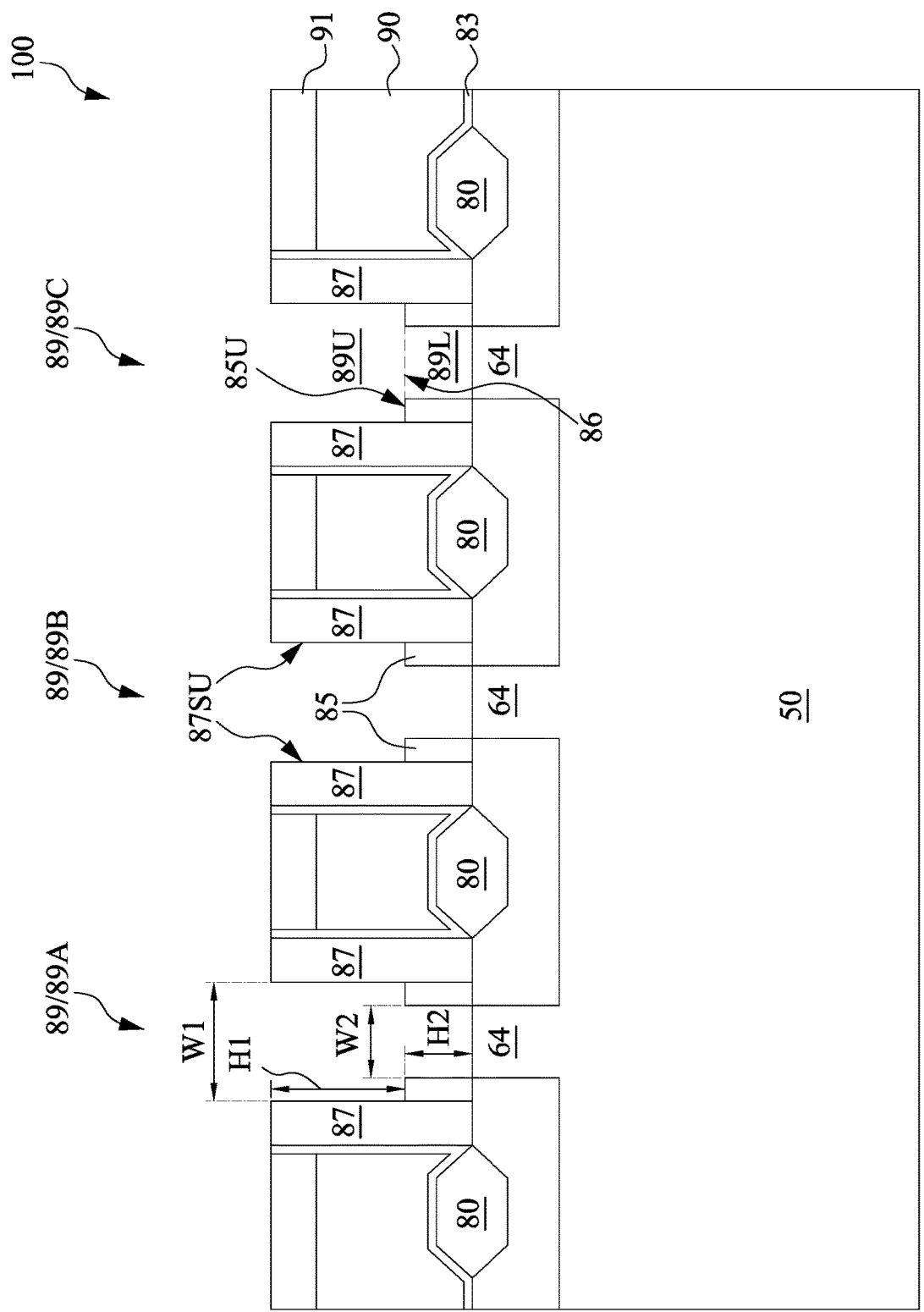

Next, in FIG. 9, the dummy gate structures 75A, 75B, and 75C (see FIG. 7A) are removed to form gate trenches 89A, 89B, and 89C, respectively. Next, upper portions of the gate trenches 89A, 89B, and 89C are expanded by removing upper portions of the first gate spacers 85, such that each of the gate trenches 89A, 89B, and 89C has an upper trench 89U and a lower trench 89L, where the upper trench 89U is wider than the lower trench 89L. Details of forming the gate trenches 89A, 89B, and 89C are discussed hereinafter. For simplicity, the gate trenches 89A, 89B, and 89C may be collectively referred to as gate trenches 89.

In some embodiments, to remove the dummy gate structures 75, one or more etching steps are performed to remove the gate 68 and the gate dielectric 66 directly under the gate 68, so that the gate trenches 89 (may also be referred to as recesses) are formed between respective first gate spacers 85. Each gate trench 89 exposes the channel region of a respective fin 64. During the dummy gate removal, the gate dielectric 66 may be used as an etch stop layer when the gate 68 is etched. The gate dielectric 66 may then be removed after the removal of the gate 68.

Next, an anisotropic etching process, such as a dry etch process, is performed to remove upper portions of the first gate spacer 85. In some embodiments, the anisotropic etching process is performed using an etchant that is selective to (e.g., having a higher etching rate for) the material of the first gate spacer 85, such that the first gate spacer 85 is recessed (e.g., upper portions removed) without substantially attacking the second gate spacer 87, the dielectric layer 91, and the fin 64. After the upper portions of the first gate spacers 85 are removed, upper sidewalls 87SU of the second gate spacer 87 are exposed.

As illustrated in FIG. 9, after the upper portions of the first gate spacers 85 are removed, each of the gate trenches 89 has an upper trench 89U and a lower trench 89L. The lower trench 89L is between the remaining lower portions of the first gate spacer 85. The upper trench 89U is over the lower trench, and is defined (e.g., bordered) by the upper sidewalls 87SU of the second gate spacer 87. FIG. 9 illustrates an interface 86 between the upper trench 89U and the lower trench 89L, which interface 86 is level with the upper surface 85U of the remaining lower portions of the first gate spacer 85. Each of the gate trenches 89 has a wider upper trench 89U and a narrow lower trench 89L, which resembles the letter "Y," and therefore, the gate trenches 89 may be referred to as Y-shaped gate trenches. The Y-shaped gate trenches are used as a non-limiting example. The trench filling methods disclosed herein are applicable for trenches with other shapes and/or dimensions, as one skilled in the art readily appreciates.

In some embodiments, the upper trench 89U has a width W1 (e.g., a distance between opposing upper sidewalls 87SU) and a depth H1 (e.g., a distance between the upper surface of the second gate spacer 87 and the interface 86). The lower trench 89L has a width W2 (e.g., a distance between opposing sidewalls of the remaining lower portions of the first gate spacer 85) and a depth H2 (e.g., a distance between the bottom of the gate trench 89 and the interface 86). The width W1 and W2 may be between about 1 nm and about 100 nm. The depth H2 may be between about 0 nm and about 300 nm, and a total trench depth H1+H2 may be between about 10 nm and about 300 nm. As will be described in subsequent processing, metal gates 97 (see, e.g., FIG. 13) are formed in the lower trenches 89L. Therefore, the size of the lower trench 89L determines the size of the metal gates, in some embodiments.

Figure 10:
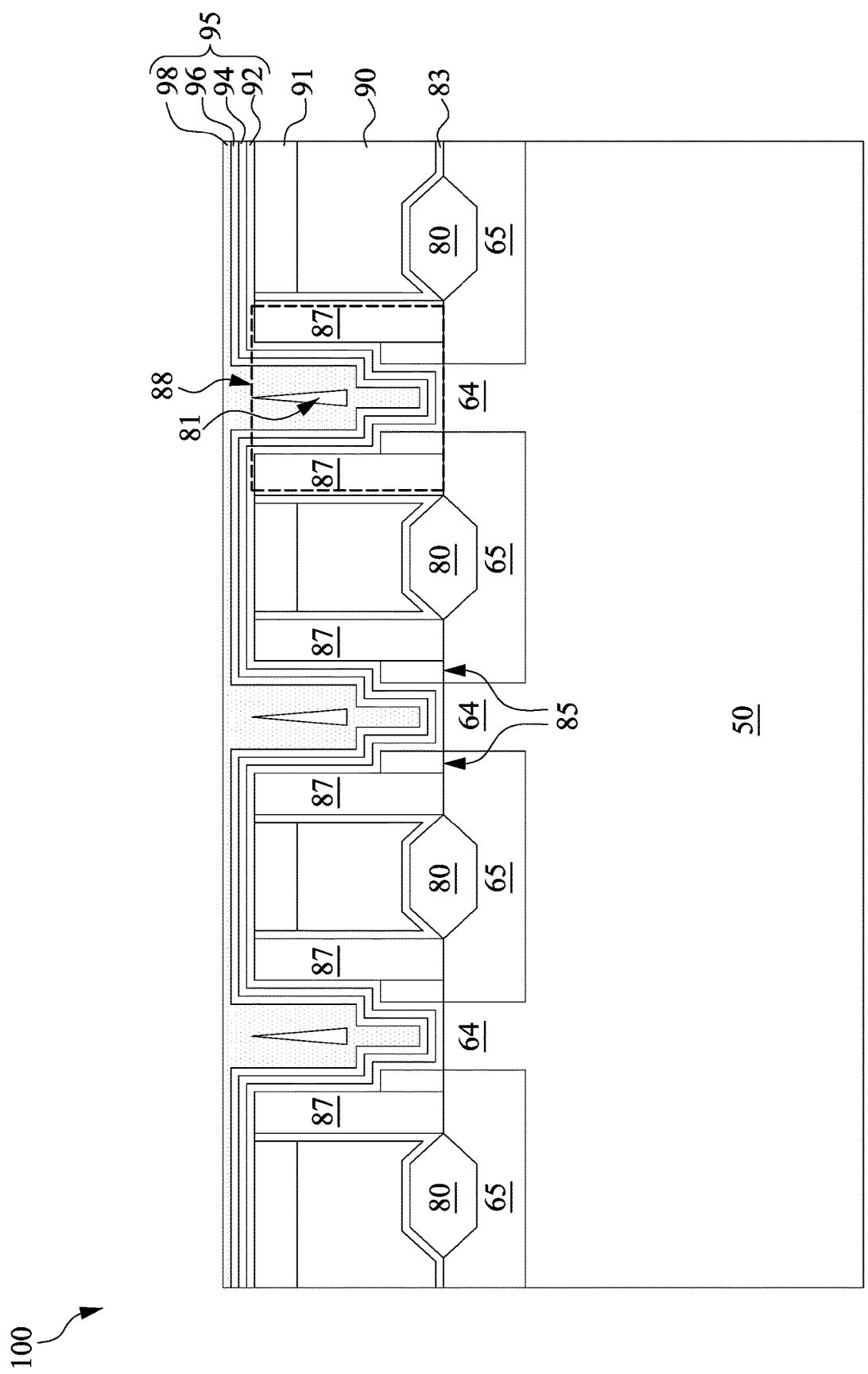

Next, in FIG. 10, a gate dielectric layer 92, a work function layer 94, a work function layer 96, and a gap-filling material 98 are formed successively in the gate trenches 89. The gate dielectric layer 92, the work function layers 94 and 96, and the gap-filling material 98 are collectively referred to as a gate stack 95 in the discussion herein. The gate stack 95 may also be referred to as a metal-gate stack.

As illustrated in FIG. 10, the gate dielectric layer 92 is deposited conformally in the gate trenches 89, such as on the top surfaces and the sidewalls of the fins 64, on the top surfaces and the sidewalls of the gate spacers 85/87, and on the top surface of the dielectric layer 91. In accordance with some embodiments, the gate dielectric layer 92 comprises silicon oxide, silicon nitride, or multilayers thereof. In example embodiments, the gate dielectric layer 92 includes a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of gate dielectric layer 92 may include molecular beam deposition (MBD), atomic layer deposition (ALD), PECVD, and the like.

Next, the work function layers 94 is formed (e.g., conformally) over the gate dielectric layer 92, and the work function layer 96 is formed (e.g., conformally) over the work function layer 94. In the illustrated embodiment, the work function layer 94 is a P-type work function layer, and the work function layer 96 is an N-type work function layer. In the discussion herein, a work function layer may also be referred to as a work function metal. Although two work function layers are illustrated in FIG. 10, any suitable number of work function layers may be used, and each of the work function layers may be any suitable type (e.g., N-type or P-type) of work function metal.

Example P-type work function metals that may be included in the gate structures include TiN, TaN, Ru, Mo, Al, WN, ZrSi2, MoSi2, TaSi2, NiSi2, other suitable P-type work function materials, or combinations thereof. Example N-type work function metals that may be included in the gate structures include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), ALD, and/or other suitable process. In an example embodiment, the work function layer 94 (e.g., a P-type work function layer) is formed of TiN, TiSiN, TiAlN, WCN, or the like, and the work function layer 96 (e.g., an N-type work function layer) is formed of TiAlC, or the like.

Next, a capping layer (not illustrated), which is optional, is formed (e.g., conformally) over the work function layer 96. The capping layer, if formed, protects the underlying work function layer 96 from being oxidized. The capping layer may comprise elements such as Ti, N Si, C, O, Al, or combinations thereof. In some embodiments, the capping layer is a silicon-containing layer, such as a layer of silicon, a layer of silicon oxide, or a layer of silicon nitride formed by a suitable method such as ALD, MBD, CVD, or the like. In some embodiments, the capping layer is omitted.

Next, the gap-filling material 98 (may also be referred to as a gap-filling film or a gap-filling layer) is formed over the work function layer 96 (or the capping layer of the work function layer 96, if formed) to fill the gate trenches 89. In some embodiments, the gap-filling material 98 is an electrically conductive material. In an example embodiment, the gap-filling material 98 is formed of an aluminum-containing material, such as titanium aluminum nitride (TiAlN), titanium aluminum carbide (TiAlC), aluminum nitride (AlN), or aluminum oxide ($AlO_3$), using a suitable deposition method such as CVD, PVD, ALD, or the like. A temperature of the deposition process may be between about 250° C. and about 450° C. A thickness of the deposited gap-filling material 98 may be between about 5 angstroms and about 100 angstroms.

As feature size continues to shrink in advanced semiconductor manufacturing process, it becomes increasingly difficult to fill trenches with high aspect ratios. In the example of FIG. 10, seams 81 (may also be referred to as gaps or cavities) are formed in the gap-filling material 98 in the gate trenches 89, due to difficulties in filling the gate trenches 89. In the illustrated example, the seams 81 are enclosed spaces in the gap-filling material 98. In other embodiments, the seams 81 may be gaps that extend to the upper surface of the gap-filling material 98 distal from the substrate 50. The seams 81, if left untreated, may cause over-etching of the gap-filling material 98 in regions underlying the seams 81 in a subsequent metal gate etch-back process. The seam induced over-etching may be referred to as seam-induced punch-through effect, or simply punch-through effect. The present disclosure removes the seams 81 by treating the gap-filling material 98 with a fluorine-containing chemical, details of which are disclosed hereinafter.

FIGS. 11-17 illustrate additional processing steps to form the FinFET device 100. For simplicity, FIGS. 11-16 each illustrates only a portion of the FinFET device 100. In particular, FIGS. 11-16 each illustrates a zoomed-in view of a region 88 in FIG. 10. For example, FIG. 11 shows the region 88 of FIG. 10 after the gap-filling material 98 is formed. A seam 81 is illustrated in the gap-filling material 98 in FIG. 11.

Referring next to FIG. 12, the gap-filling material 98 is treated (e.g., doped) with a fluorine-containing chemical to close (e.g., remove) the seams 81. In the illustrated embodiment, the volume of the gap-filling material 98 is increased by the treatment using the fluorine-containing chemical (also referred to as fluorine treatment). In other words, the gap-filling material 98 expands after being treated by the fluorine-containing chemical, and the expansion of the gap-filling material 98 causes the gap-filling material 98 to fill (e.g., take up) the spaces of the seams 81, thus removing the seams 81. After the fluorine treatment, the gap-filling material 98 completely fills the gate trenches 89, and seams 81 no longer exist in the gap-filling material 98. In the discussion herein, the fluorine-treated gap-filling material 98 may also be referred to as a fluorine-containing filling material 99, or a fluorine-doped filling material 99.

In some embodiments, the fluorine treatment of the gap-filling material 98 is a thermal process performed using a fluorine-containing gas, such as nitrogen trifluoride ($NF_3$), carbon tetrafluoride ($CF_4$), or fluorine ($F_2$). A carrier gas (e.g., Ar. He, or the like) may or may not be used, depending on the intensity of fluorination to be achieved. For example, the FinFET device 100 is positioned in a process chamber, and the fluorine-containing gas (e.g., $NF_3$, $CF_4$, $F_2$) is then supplied to the process chamber, such that the gap-filling material 98 is in contact with the fluorine-containing gas. A flow rate of the fluorine-containing gas may be between about 100 standard cubic centimeters per minute (sccm) and about 8000 sccm. A ratio between the flow rate of the fluorine-containing gas and the carrier gas may be between about 0.01:1 and 1:0. A temperature of the fluorine treatment thermal process may be between about 25° C. and about 600° C. In the illustrated embodiments, the fluorine in the fluorine-containing gas diffuses into the gap-filling material 98 and reacts (e.g., combines, or chemically reacts) with the aluminum in the gap-filling material 98 to form aluminum fluoride (e.g., $AlF_x$).

In some embodiments, the fluorine treatment of the gap-filling material 98 is a plasma process performed using a fluorine-containing gas, such as $NF_3$, $CF_4$, or $F_2$. For example, the fluorine-containing gas (e.g., $NF_3$, $CF_4$, $F_2$) is ignited into a plasma, and the fluorine-containing plasma is supplied to a processing chamber where the FinFET device 100 is positioned. The gap-filling material 98 is therefore treated by the fluorine-containing plasma. A carrier gas (e.g., Ar. He, or the like) may or may not be used, depending on the intensity of fluorination to be achieved. A flow rate of the fluorine-containing gas for the plasma process may be between about 100 sccm and about 8000 sccm. A ratio between the flow rate of the fluorine-containing gas and the carrier gas may be between about 0.01:1 and 1:0. A temperature of the plasma process may be between about 25° C. and about 500° C. A pressure of the plasma process may be between about 0.1 torr and about 50 torr, and an RF power for the plasma process may be between about 50 W and about 5000 W. In some embodiments, the fluorine-containing plasma diffuses into the gap-filling material 98 and reacts (e.g., combines, or chemically reacts) with the aluminum in the gap-filling material 98 to form aluminum fluoride (e.g., $AlF_x$).

In the illustrated embodiment of FIG. 12, with proper tuning on the fluorine-treatment intensity, and due to the strong affinity between fluorine (F) and aluminum (Al), diffusion of the fluorine (F) from the fluorine-containing gas or the fluorine-containing plasma is limited to within the gap-filling material 98, and other materials (e.g., 96, 94, 92) of the gate structure are not affected by the fluorine treatment, thus are substantially free of fluorine.

Figure 13:
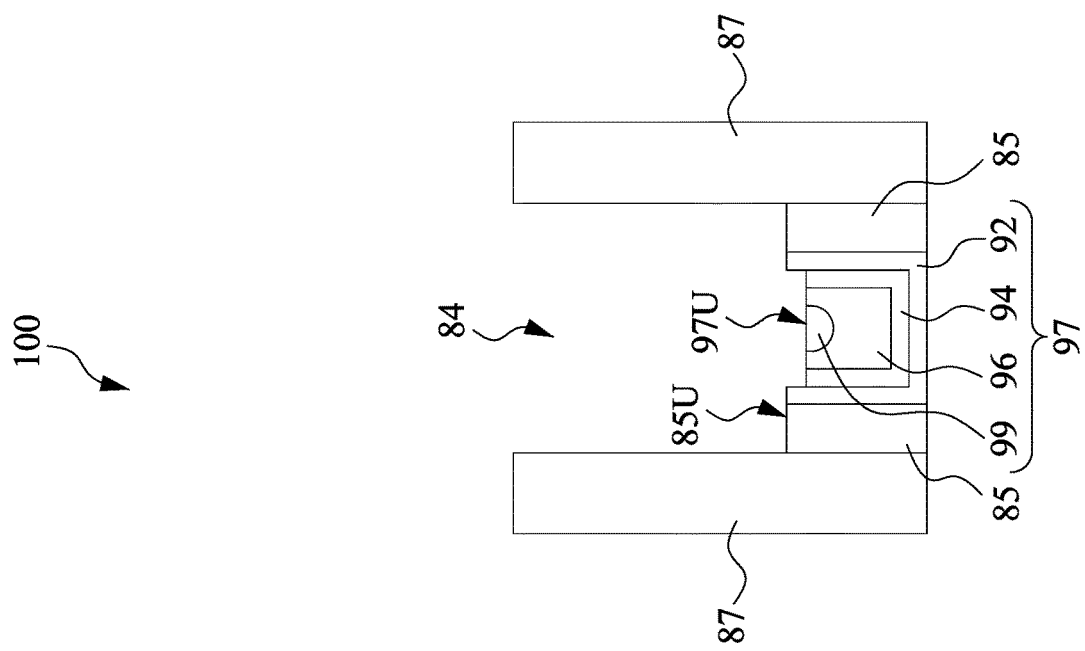

Next, in FIG. 13, a metal gate etch-back process is performed to remove upper portions of the gate stack 95 (e.g., upper portions of the gate dielectric layer 92, upper portions of the work function layers 94/96, and upper portions of the fluorine-containing filling material 99). Recesses 84 are formed between the second gate spacers 87 after the metal gate etch-back process. A suitable etching process, such as dry etch, wet etch, or combinations thereof, may be performed as the metal gate etch-back process. An etchant for the etching process may be a halide (e.g., $CCl_4$), an oxidant (e.g., $O_2$), an acid (e.g., HF), a base (e.g., $NH_3$), an inert gas (e.g., Ar), combinations thereof, or the like. In the example of FIG. 13, due to the etchant having an etching selectivity between the different materials (e.g., 92, 94, 96, 99), after the etching process, an upper surface of the remaining portions of the gate dielectric layer 92 is level with the upper surface 85U of the first gate spacer 85, and an upper surface 97U of the remaining portions of the work function layers 94/96 and the fluorine-containing filling material 99 are lower (e.g., closer to the substrate 50) than the upper surface 85U. In other embodiments, the upper surface of the remaining portions of the gate dielectric layer 92 is level with the upper surface 97U. The upper surface 97U of the remaining portions of the work function layers 94/96 and the fluorine-containing filling material 99 may extend above a top surface of the fin 64 by about 2 angstroms to about 20 angstroms. After the metal gate etch-back process, the remaining portions of the gate dielectric layer 92, the remaining portions of the work function layers 94/96, and the remaining portions of the fluorine-containing filling material 99 form the metal gate 97 (may also be referred to as a metal gate structure, or a replacement gate structure).

Figure 14:
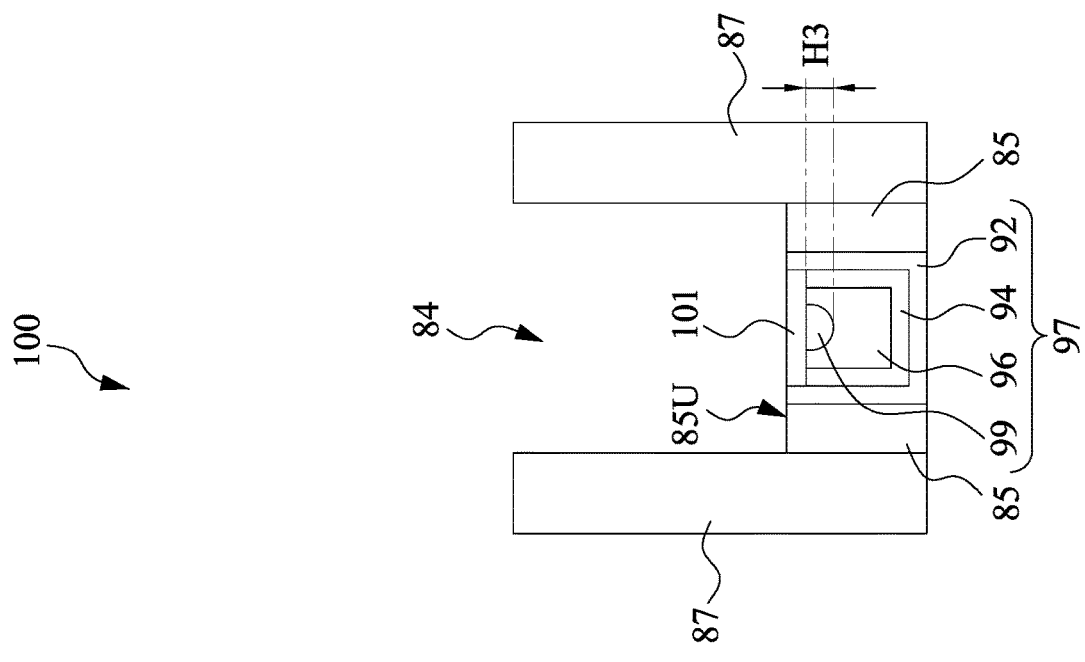

Next, in FIG. 14, a capping layer 101 is formed over the remaining portions of the work function layers 94/96 and the fluorine-containing filling material 99. The capping layer 101 is formed of an electrically conductive material, such as tungsten, using a suitable deposition method, such as ALD, CVD, PVD, or the like. In the example of FIG. 14, the capping layer 101 is selectively formed over the remaining portions of the work function layers 94/96 and the fluorine-containing filling material 99, although a non-selective formation method may also be used.

Note that due to the fluorine treatment of the gap-filling material 98, seams 81 in the gap-filling material 98 are removed. As a result, after the metal gate etch-back process, the seam-induced punch-through effect is avoided. Without the fluorine treatment of the gap-filling material 98, the seam-induced punch-through effect may cause divots (e.g., recesses, or holes) in the upper surface 97U of the remaining portions of the work function layers 94/96 and the gap-filling material 98, and the capping layer 101 may not be formed properly in or around the divots. The non-growth of the capping layer 101 in or around the divots may degrade device performance due to, e.g., higher electrical resistance. In addition, the punch-through effect may damage the top of the fin 64. By avoiding or reducing the punch-through effect, the present disclosure improves production yields and achieves better device performance.

As illustrated in FIG. 14, the capping layer 101 fully covers the upper surface 97U of the remaining portions of the work function layers 94/96 and the fluorine-containing filling material 99. In other words, the capping layer 101 completely covers (e.g., extends along and physically contacts) the upper surface 97U. In FIG. 14, the capping layer 101 extends continuously from a first inner sidewall (e.g., a sidewall facing the fluorine-containing filling material 99) of the gate dielectric layer 92 to an opposing second inner sidewall of the gate dielectric layer 92. The capping layer 101 has a uniform thickness, in some embodiments. A lower surface of the capping layer 101 facing the substrate 50 is substantially parallel to a major upper surface of the substrate 50, in some embodiments. In the example of FIG. 14, an upper surface of the capping layer 101 distal from the substrate 50 is level with the upper surface 85U of the first gate spacer 85. The fluorine-containing filling material 99 is disposed below the capping layer 101, and has a height H3 between about 5 angstroms and about 300 angstroms, in some embodiments.

Next, in FIG. 15, a semiconductor material 111, such as silicon, is formed in the recesses 84, using a suitable formation method such as PVD, CVD, or the like. Next, a gate contact 102 is formed in the semiconductor material 111 to electrically couple to the capping layer 101. To form the gate contact 102 (also referred to as contact plugs), a contact opening is formed in the semiconductor material 111 to expose the capping layer 101, using, e.g., photolithography and etching. Once the contact opening is formed, a barrier layer 104, a seed layer 109, and a fill metal 110 are formed successively in the contact opening to form the gate contact 102.

In some embodiment, the barrier layer 104 comprises an electrically conductive material such as titanium nitride, although other materials, such as tantalum nitride, titanium, tantalum, or the like, may alternatively be utilized. The barrier layer 104 may be formed using a CVD process, such as PECVD. However, other alternative processes, such as sputtering, metal organic chemical vapor deposition (MOCVD), or ALD, may alternatively be used.

Next, the seed layer 109 is formed over the barrier layer 104. The seed layer 109 may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sub-layers formed of different materials. For example, the seed layer 109 may comprise a titanium layer and a copper layer over the titanium layer.

Next, the fill metal 110 is deposited over the seed layer 109, and fills the remaining portions of the contact opening. The fill metal 110 may be a metal-containing material such as Cu, Al, W, the like, combinations thereof, or multi-layers thereof, and may be formed by, e.g., electroplating, electroless plating, or other suitable method. After the formation of the fill metal 110, a planarization process, such as a CMP, may be performed to remove the excess portions of the barrier layer 104, the seed layer 109, and the fill metal 110, which excess portions are over the upper surface of the dielectric layer 91 (see FIG. 10) and over the upper surface of the second gate spacer 87. The resulting remaining portions of the barrier layer 104, the seed layer 109, and the fill metal 110 thus form the gate contact 102.

Next, in FIG. 16, the semiconductor material 111 is replaced with a dielectric material 113. The semiconductor material 111 may be removed by an etching process using an etchant that is selective to the semiconductor material 111. After the semiconductor material 111 is removed, the dielectric material 113 (e.g., silicon oxide, silicon nitride, a low-K dielectric material, or the like) is formed to fill the space previously occupied by the semiconductor material 111.

Figure 17:
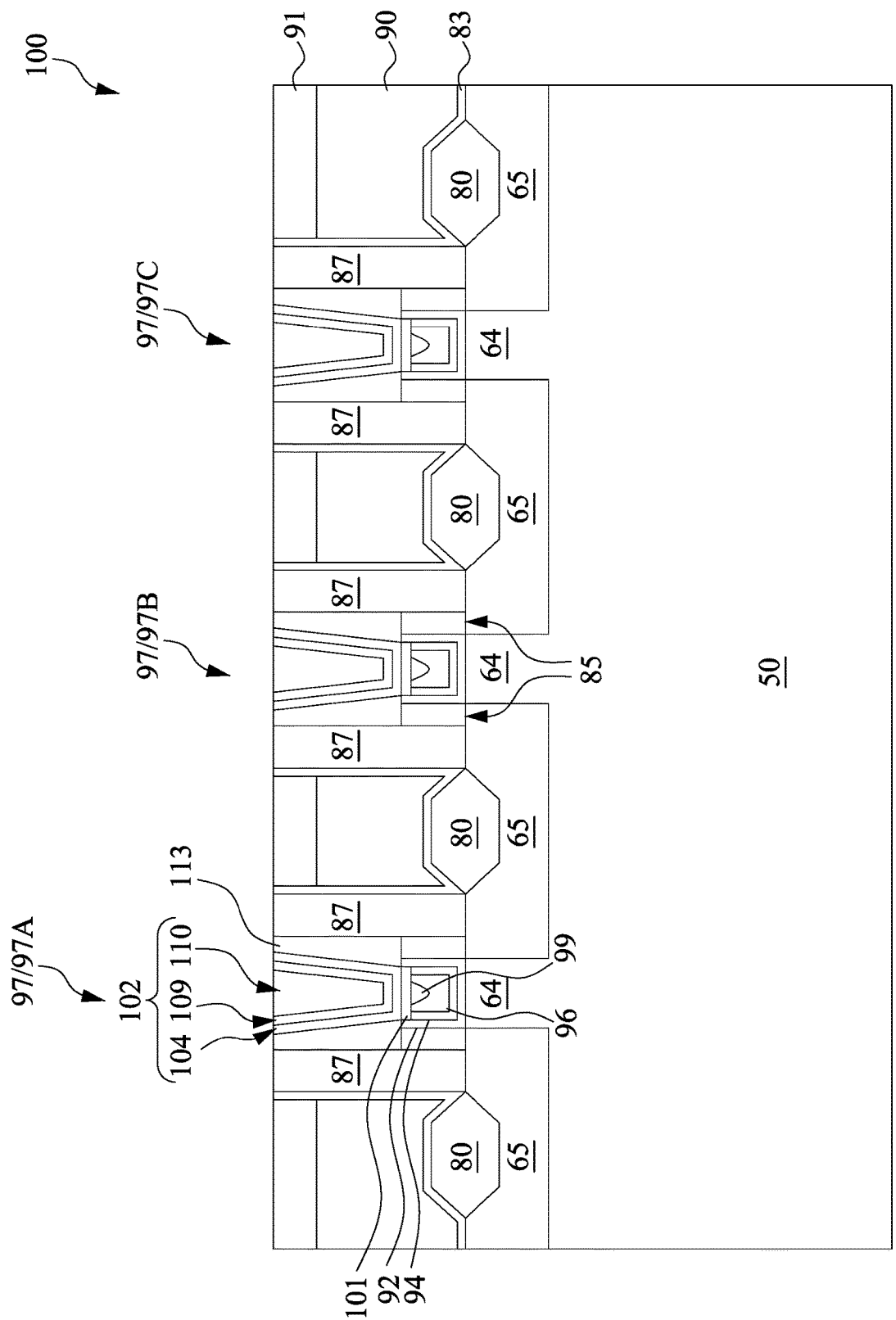

FIG. 17 shows the cross-sectional view of the FinFET device 100 after the dielectric material 113 replaces the semiconductor material 111. As illustrated in FIG. 17, metal gates 97A, 97B, and 97C, which replace the dummy gate structure 75A, 75B, and 75C, respectively, are formed over the fin 64. One skilled in the art will appreciate that additional processing may be performed to finish the fabrication of the FinFET device 100, such as forming source/drain contacts and forming metallization layers over the dielectric layer 91. For brevity, details are not discussed herein.

Figure 20:
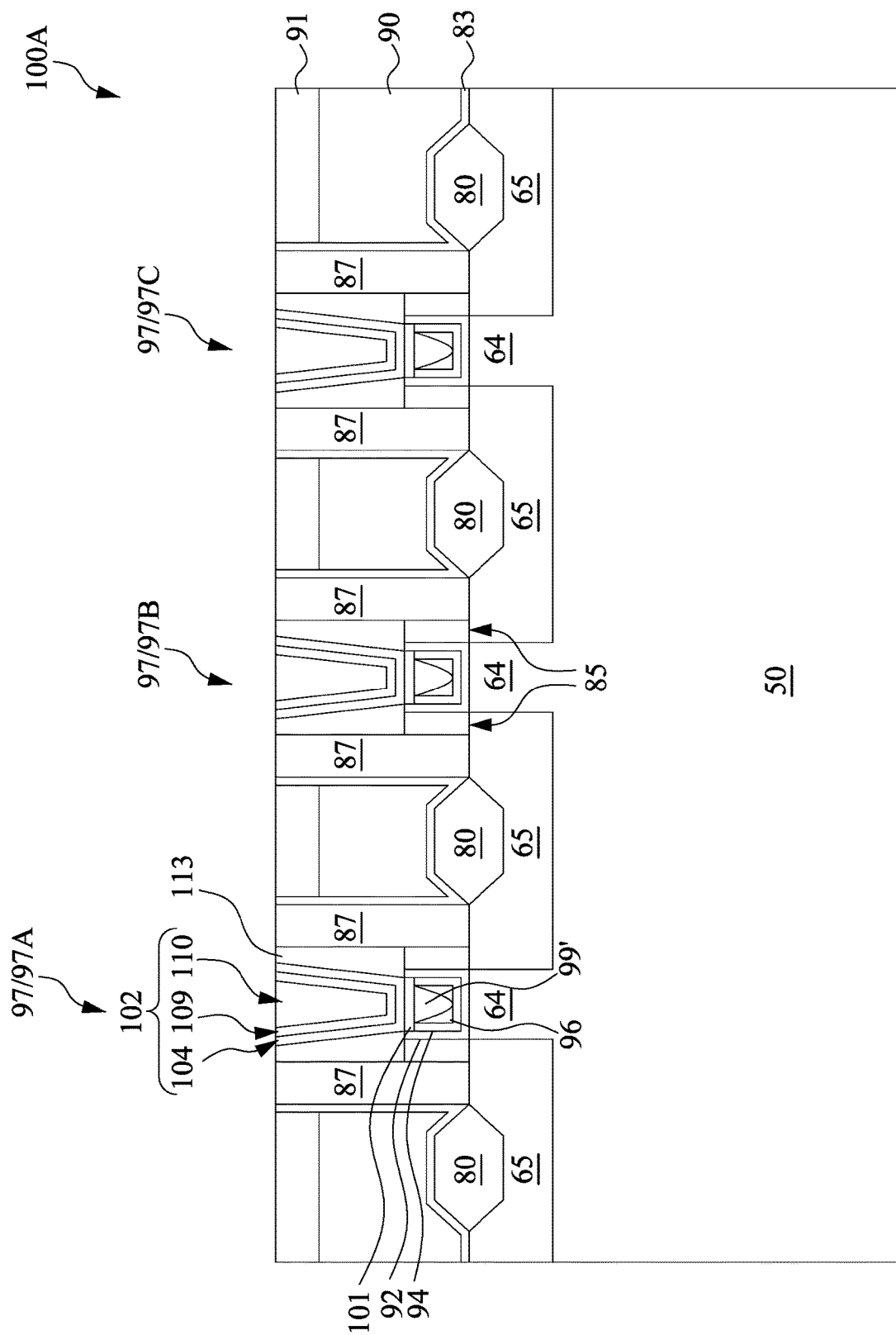

FIGS. 18-20 illustrate cross-sectional views of a FinFET device 100A at various stages of fabrication, in accordance with another embodiment. The FinFET device 100A is similar to the FinFET device 100, but with a different level (e.g., higher level) of fluorination during the fluorine treatment of the gap-filling material 98.

The processing of FIG. 18 follows that of FIGS. 1-11. In other words, FIGS. 1-11 and 18-20 illustrate the processing steps of the FinFET device 100A. In FIG. 18, the gap-filling material 98 is treated by the fluorine treatment process (e.g., a thermal process or a plasma process) similar to FIG. 12 to remove the seams 81, but at a higher fluorination intensity than the fluorine treatment of FIG. 12. The intensity of fluorination can be enhanced by, e.g., raising process temperature, increasing plasma power of the plasma process, increasing flow rate of the fluorine-containing gas, and/or increasing treatment pressure. In addition, changing the gas used as the fluorine-containing gas may also change the intensity of fluorination. As a result of the higher intensity of the fluorine treatment process, the fluorine diffuses into the gap-filling material 98 and portions of the work function layer 96 contacting the gap-filling material 98. FIG. 18 illustrates the fluorine-doped region 99' of the metal-gate stack after the fluorine treatment, where the fluorine-doped region 99' includes the gap-filling material 98 and portions of the work function layer 96 contacting the gap-filling material 98. Note that in FIG. 12, the diffusion of the fluorine is limited to within the gap-filling material 98, thus the fluorine-doped filling material 99 of FIG. 12 has a same boundary as the gap-filling material 98, whereas the fluorine-doped region 99' in FIG. 18 extends beyond the boundary of the gap-filling material 98. Note that besides the intensity level of the fluorine treatment process, other factors, such as the material choice of the metal-gate stack, the stacking order of the different layers of the metal-gate stack, may also affect the boundary of the fluorine-doped region 99'.

Next, in FIG. 19, the metal gate etch-back process same as or similar to that of FIG. 13 is performed to remove upper portions of the gate dielectric layer 92, upper portions of the work function layers 94/96, and upper portions of the fluorine-doped region 99'. Recesses 84 are formed between second gate spacers 87. The remaining portions of the gate dielectric layer 92, remaining portions of the work function layers 94/96, and remaining portions of the fluorine-doped region 99' form the metal gate structure 97 of the FinFET device 100A. Next, the capping layer 101 is formed over the remaining portions of the work function layers 94/96 and remaining portions of the fluorine-doped region 99', using a deposition process same as or similar to that of FIG. 14. Note that due to the higher intensity of fluorine treatment, the fluorine-doped region 99' disposed below the capping layer 101 has a height H4, which is larger than the height H3 of the fluorine-doped filling material 99 in FIG. 14.

Next, processing same as or similar to those of FIGS. 15 and 16 are performed. For example, the semiconductor material 111 is formed in the recesses 84, and gate contacts 102 are formed in the semiconductor material 111 and are electrically coupled to the capping layer 101. Next, the semiconductor material 111 is replaced with the dielectric material 113. FIG. 20 shows the cross-sectional view of the FinFET device 100A after the dielectric material 113 replaces the semiconductor material 111. As illustrated in FIG. 20, metal gates 97A, 97B, and 97C, which replace the dummy gate structure 75A, 75B, and 75C, respectively, are formed over the fin 64. One skilled in the art will appreciate that additional processing may be performed to finish the fabrication of the FinFET device 100A, such as forming source/drain contacts and forming metallization layers over the dielectric layer 91. For brevity, details are not discussed herein.

Figure 23:
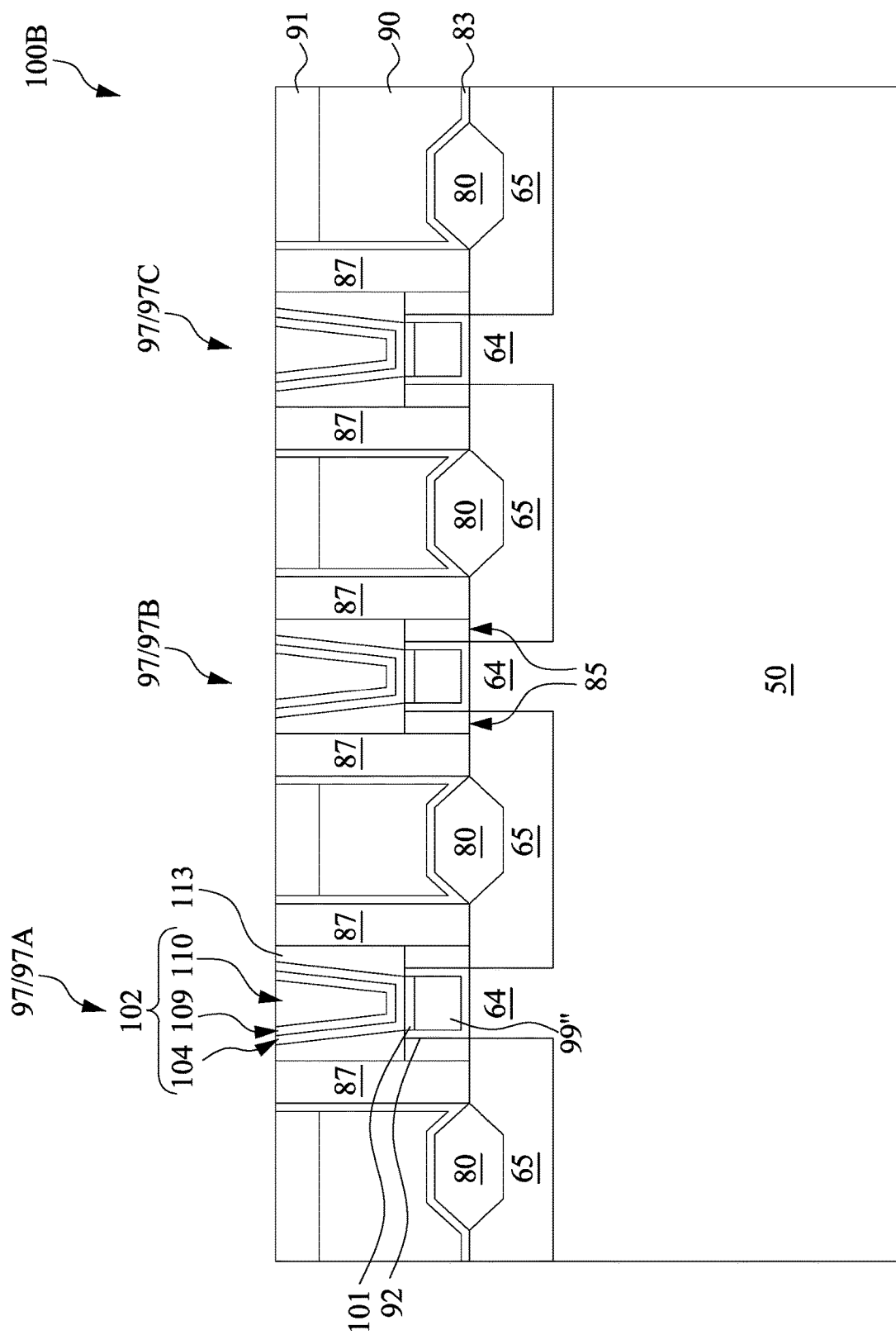

FIGS. 21-23 illustrate cross-sectional views of a FinFET device 100B at various stages of fabrication, in accordance with yet another embodiment. The FinFET device 100B is similar to the FinFET device 100A, but with a higher level of fluorination during the fluorine treatment of the gap-filling material 98.

The processing of FIG. 21 follows that of FIGS. 1-11. In other words, FIGS. 1-11 and 21-23 illustrate the processing steps of the FinFET device 100B. In FIG. 21, the gap-filling material 98 is treated by the fluorine treatment process (e.g., a thermal process or a plasma process) similar to FIG. 12 to remove the seams 81, but at a higher intensity (e.g., longer duration, higher temperature, and/or higher flow rate of the fluorine-containing gas), such that the fluorine diffuses into the gap-filling material 98 and the work function layers 96 and 94. FIG. 21 illustrates the fluorine-doped region 99" of the metal-gate stack after the fluorine treatment process, where the fluorine-doped region 99" includes all of the gap-filling material 98 and the work function layers 96 and 94.

Next, in FIG. 22, the metal gate etch-back process same as or similar to that of FIG. 13 is performed to remove upper portions of the gate dielectric layer 92, upper portions of the work function layers 94/96, and upper portions of the fluorine-doped region 99". Recesses 84 are formed between second gate spacers 87. The remaining portions of the gate dielectric layer 92, remaining portions of the work function layers 94/96, and remaining portions of the fluorine-doped region 99" form the metal gate structure 97 of the FinFET device 100B. Next, the capping layer 101 is formed over the remaining portions of the work function layers 94/96 and remaining portions of the fluorine-doped region 99", using a deposition process same as or similar to that of FIG. 14.

Next, processing same as or similar to those of FIGS. 15 and 16 are performed. For example, the semiconductor material 111 is formed in the recesses 84, and gate contacts 102 are formed in the semiconductor material 111 and are electrically coupled to the capping layer 101. Next, the semiconductor material 111 is replaced with the dielectric material 113. FIG. 23 shows the cross-sectional view of the FinFET device 100B after the dielectric material 113 replaces the semiconductor material 111. As illustrated in FIG. 23, metal gates 97A, 97B, and 97C, which replace the dummy gate structure 75A, 75B, and 75C, respectively, are formed over the fin 64. One skilled in the art will appreciate that additional processing may be performed to finish the fabrication of the FinFET device 100B, such as forming source/drain contacts and forming metallization layers over the dielectric layer 91. For brevity, details are not discussed herein.

Embodiment may achieve advantages. For example, the fluorine treatment process removes seams 81, thereby preventing or reducing seam-induced punch-through effect. As a result, non-growth of the capping layer 101 is prevented, and damage to the top of the fin 64 is avoided, which improves the device performance and production yields. As semiconductor manufacturing process continues to advance, the distance (e.g., pitch) between adjacent metal gates 97 are getting closer and closer. For advanced processing nodes such as 5 nm or beyond, the small pitch between metal gates 97 may cause metal gate leakage, which decreases the reliability of the device formed. Compared with a reference design where metal gates 97 are formed between the second gate spacers 87 (e.g., with the first gate spacers 85 completely removed and the metal gate 97 filling the space between the second gate spacers 87), the current disclosure, by forming the metal gates 97 between the recessed first gate spacers 85, increases the pitch between metal gates 97, thereby reducing the metal gate leakage and increasing device reliability. The increased pitch between adjacent metal gates 97 may also increase the pitch between adjacent gate contacts 102, which in combination with the fact that the gate contact 102 is surrounded by the second gate spacers 87, prevent or reduces the likelihood of electrical short between adjacent gate contacts 102.

Variations and modifications to the disclosed embodiments are possible and are fully intended to be included within the scope of the present disclosure. For example, in FIGS. 17, 20, and 23, all of the metal gates 97 (e.g., 97A, 97B, and 97C) have a same structure (e.g., same film scheme in the metal gates). In other embodiments, the metal gates 97 may have different structures. For example, each of the metal gates 97A, 97B, and 97C may have different work function layer(s) to achieve different threshold voltages, and/or to form metal gates in different regions (e.g. N-type device region or P-type device region) of the FinFET device. As another example, the fluorination level for each of the metal gates 97A, 97B, and 97C may be different, such that the metal gate 97A may have the fluorine-doped filling material 99 as in FIG. 17, the metal gate 97B may have the fluorine-doped region 99' as in FIG. 20, and the metal gate 97C may have the fluorine-doped region 99" as in FIG. 23.

Figure 24:
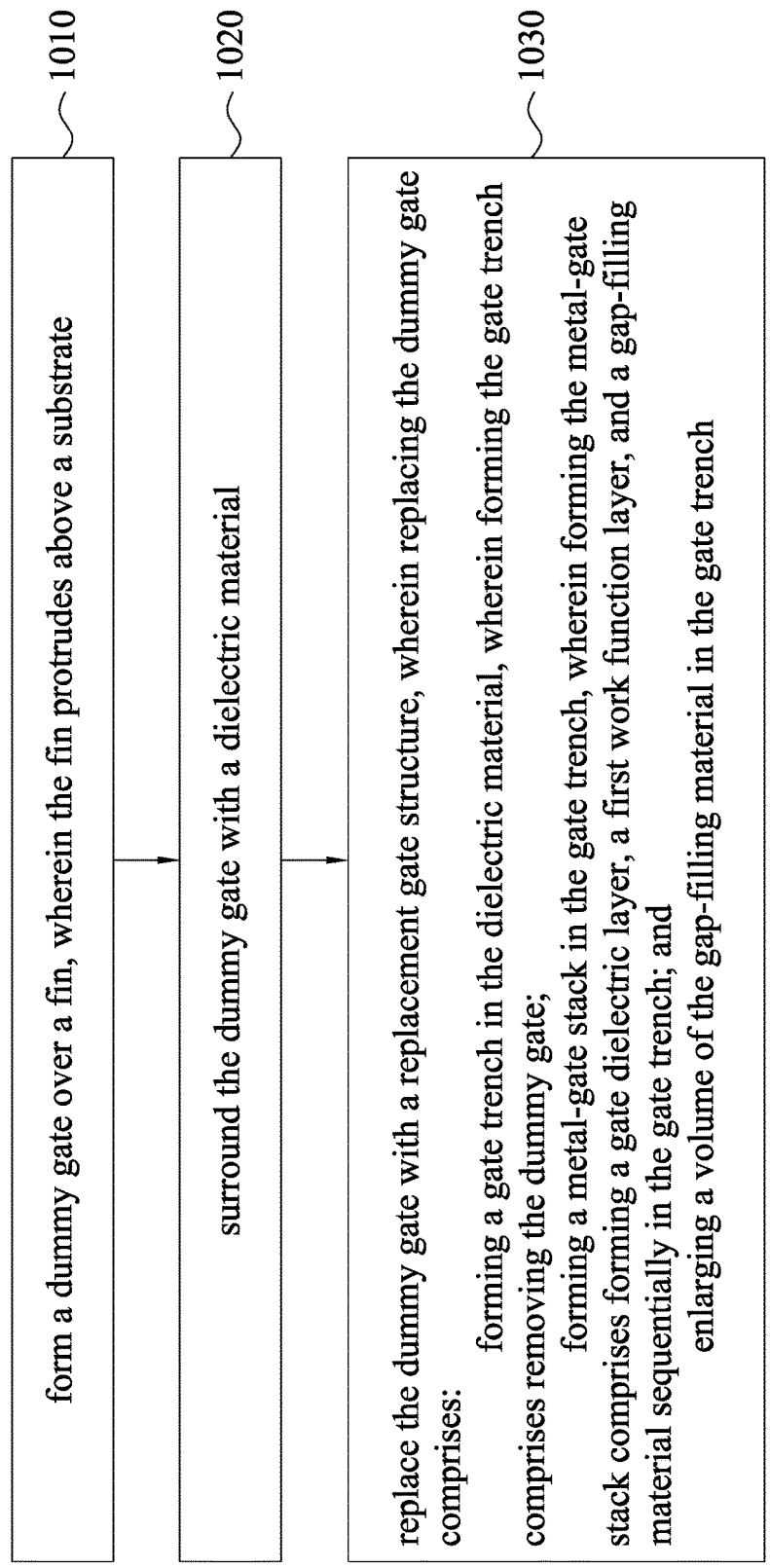
FIG. 24 illustrates a flow chart of method of making a semiconductor device, in accordance with some embodiments.

FIG. 24 illustrates a flow chart of a method of fabricating a semiconductor device, in accordance with some embodiments. It should be understood that the embodiment method shown in FIG. 24 is merely an example of many possible embodiment methods. One of ordinary skill in the art would recognize many variations, alternatives, and modifications. For example, various steps as illustrated in FIG. 24 may be added, removed, replaced, rearranged and repeated.

Referring to FIG. 24, at block 1010, a dummy gate is formed over a fin, wherein the fin protrudes above a substrate. At block 1020, the dummy gate is surrounded with a dielectric material. At block 1030, the dummy gate is replaced with a replacement gate structure, wherein replacing the dummy gate comprises: forming a gate trench in the dielectric material, wherein forming the gate trench comprises removing the dummy gate; forming a metal-gate stack in the gate trench, wherein forming the metal-gate stack comprises forming a gate dielectric layer, a first work function layer, and a gap-filling material sequentially in the gate trench; and enlarging a volume of the gap-filling material in the gate trench.

In an embodiment, a method of forming a semiconductor device includes: forming a dummy gate over a fin, wherein the fin protrudes above a substrate; surrounding the dummy gate with a dielectric material; and replacing the dummy gate with a replacement gate structure, wherein replacing the dummy gate comprises: forming a gate trench in the dielectric material, wherein forming the gate trench comprises removing the dummy gate; forming a metal-gate stack in the gate trench, wherein forming the metal-gate stack comprises forming a gate dielectric layer, a first work function layer, and a gap-filling material sequentially in the gate trench; and enlarging a volume of the gap-filling material in the gate trench. In an embodiment, after forming the metal-gate stack and before the enlarging, there is a cavity in the gap-filling material. In an embodiment, after the enlarging, the cavity is filled by the enlarged gap-filling material. In an embodiment, the gap-filling material is formed of an aluminum-containing material, and wherein enlarging the volume comprises treating the gap-filling material with a fluorine-containing chemical. In an embodiment, the gap-filling material is formed of titanium aluminum nitride, titanium aluminum carbide, aluminum nitride, or aluminum oxide. In an embodiment, the fluorine-containing chemical is nitrogen trifluoride, carbon tetrafluoride, or fluorine. In an embodiment, treating the gap-filling material comprises treating the gap-filling material with a fluorine-containing gas in a thermal process. In an embodiment, treating the gap-filling material comprises treating the gap-filling material with a plasma of a fluorine-containing gas. In an embodiment, the method further comprises: etching the metal-gate stack such that the metal-gate stack recesses from an upper surface of the dielectric material; forming a capping layer over the recessed metal-gate stack; and forming a gate contact in the dielectric material over the capping layer. In an embodiment, the capping layer extends along and contacts an upper surface of the gap-filling material. In an embodiment, the capping layer is formed of tungsten. In an embodiment, a lower surface of the capping layer contacting the gap-filling material extends substantially parallel to a major upper surface of the substrate.

In an embodiment, a method of forming a semiconductor device includes: surrounding a dummy gate disposed over a fin with a dielectric layer, wherein the fin protrudes above a substrate; removing the dummy gate to form a trench in the dielectric layer; lining sidewalls and a bottom of the trench with a gate dielectric layer; forming one or more work function layers over the gate dielectric layer; filling the trench with a conductive material, wherein after filling the trench, there is a gap in the conductive material; and after filling the trench, treating the conductive material to expand a volume of the conductive material, wherein after the treating, the gap is removed. In an embodiment, the conductive material is an aluminum-containing material, and treating the conductive material comprises treating the conductive material with a fluorine-containing chemical. In an embodiment, treating the conductive material comprises supplying a fluorine-containing gas to the conductive material. In an embodiment, treating the conductive material comprises treating the conductive material with a plasma of a fluorine-containing gas. In an embodiment, the method further includes: after treating the conductive material, recessing the gate dielectric layer, the one or more work function layers, and the conductive material with an etching process; forming a capping layer over the one or more work function layers and the conductive material; and forming a contact plug over and electrically coupled to the capping layer.

In an embodiment, a semiconductor device includes: a substrate; a fin protruding above the substrate; a metal gate structure over the fin, wherein the metal gate structure comprises: a gate dielectric layer; a first work function layer over the gate dielectric layer; a second work function layer over the first work function layer; and an electrically conductive material extending into the second work function layer from an upper surface of the second work function layer, wherein the electrically conductive material comprises aluminum and fluorine; and a capping layer over and contacting the first work function layer, the second work function layer, and the electrically conductive material. In an embodiment, the capping layer extends continuously between opposing inner sidewalls of the gate dielectric layer facing the electrically conductive material, wherein an upper surface of the capping layer distal from the substrate is level with an upper surface of the gate dielectric layer distal from the substrate. In an embodiment, the semiconductor device further includes: a first gate spacer along a sidewall of the metal gate structure; and a second gate spacer along a sidewall of the first gate spacer, wherein the second gate spacer extends further from the substrate than the first gate spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a dummy gate over a fin, wherein the fin protrudes above a substrate;
    surrounding the dummy gate with a dielectric material; and
    replacing the dummy gate with a replacement gate structure, wherein replacing the dummy gate comprises:
        forming a gate trench in the dielectric material, wherein forming the gate trench comprises removing the dummy gate;
        forming a metal-gate stack in the gate trench, wherein forming the metal-gate stack comprises forming a gate dielectric layer, a first work function layer, and a gap-filling material sequentially in the gate trench; and
        enlarging a volume of the gap-filling material in the gate trench, wherein after forming the metal-gate stack and before the enlarging, there is a cavity in the gap-filling material.

2. The method of claim 1, wherein after the enlarging, the cavity is filled by the enlarged gap-filling material.

3. The method of claim 2, wherein the gap-filling material is formed of an aluminum-containing material, and wherein enlarging the volume comprises treating the gap-filling material with a fluorine-containing chemical.

4. The method of claim 3, wherein the gap-filling material is formed of titanium aluminum nitride, titanium aluminum carbide, aluminum nitride, or aluminum oxide.

5. The method of claim 4, wherein the fluorine-containing chemical is nitrogen trifluoride, carbon tetrafluoride, or fluorine.

6. The method of claim 3, wherein treating the gap-filling material comprises treating the gap-filling material with a fluorine-containing gas in a thermal process.

7. The method of claim 3, wherein treating the gap-filling material comprises treating the gap-filling material with a plasma of a fluorine-containing gas.

8. The method of claim 1, further comprising:
    etching the metal-gate stack such that the metal-gate stack recesses from an upper surface of the dielectric material;
    forming a capping layer over the recessed metal-gate stack; and
    forming a gate contact in the dielectric material over the capping layer.

9. The method of claim 8, wherein the capping layer extends along and contacts an upper surface of the gap-filling material.

10. The method of claim 9, wherein the capping layer is formed of tungsten.

11. The method of claim 9, wherein a lower surface of the capping layer contacting the gap-filling material extends substantially parallel to a major upper surface of the substrate.

12. A method of forming a semiconductor device, the method comprising:
    surrounding a dummy gate disposed over a fin with a dielectric layer, wherein the fin protrudes above a substrate;

removing the dummy gate to form a trench in the dielectric layer;

lining sidewalls and a bottom of the trench with a gate dielectric layer;

forming one or more work function layers over the gate dielectric layer;

filling the trench with a conductive material, wherein after filling the trench, there is a gap in the conductive material; and after filling the trench, treating the conductive material to expand a volume of the conductive material, wherein after the treating, the gap is removed.

13. The method of claim 12, wherein the conductive material is an aluminum-containing material, and treating the conductive material comprises treating the conductive material with a fluorine-containing chemical.

14. The method of claim 13, wherein treating the conductive material comprises supplying a fluorine-containing gas to the conductive material.

15. The method of claim 13, wherein treating the conductive material comprises treating the conductive material with a plasma of a fluorine-containing gas.

16. The method of claim 12, further comprising:
after treating the conductive material, recessing the gate dielectric layer, the one or more work function layers, and the conductive material with an etching process;

forming a capping layer over the one or more work function layers and the conductive material; and forming a contact plug over and electrically coupled to the capping layer.

17. A semiconductor device comprising:
a substrate;
a fin protruding above the substrate;
a metal gate structure over the fin, wherein the metal gate structure comprises:
a gate dielectric layer;
a first work function layer over the gate dielectric layer;
a second work function layer over the first work function layer; and
an electrically conductive material extending into the second work function layer from an upper surface of the second work function layer, wherein the electrically conductive material comprises aluminum and fluorine; and
a capping layer over and contacting the first work function layer, the second work function layer, and the electrically conductive material.

18. The semiconductor device of claim 17, wherein the capping layer extends continuously between opposing inner sidewalls of the gate dielectric layer facing the electrically conductive material, wherein an upper surface of the capping layer distal from the substrate is level with an upper surface of the gate dielectric layer distal from the substrate.

19. The semiconductor device of claim 18, further comprising:
a first gate spacer along a sidewall of the metal gate structure; and
a second gate spacer along a sidewall of the first gate spacer, wherein the second gate spacer extends further from the substrate than the first gate spacer.

20. The method of claim 8, wherein forming the capping layer comprises selectively forming the capping layer over the first work function layer and the gap-filling material of the recessed metal-gate stack.

* * * * *